(12) United States Patent
Hyodo et al.

(10) Patent No.: US 11,211,950 B2
(45) Date of Patent: *Dec. 28, 2021

(54) DECODING DEVICE AND DECODING METHOD

(71) Applicant: Kioxia Corporation, Tokyo (JP)

(72) Inventors: Kuminori Hyodo, Fujisawa (JP); Kenji Sakurada, Yamato (JP); Yasuhiko Kurosawa, Fujisawa (JP); Takashi Nakagawa, Chofu (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/020,397

(22) Filed: Sep. 14, 2020

(65) Prior Publication Data
US 2021/0211142 A1    Jul. 8, 2021

(30) Foreign Application Priority Data
Jan. 7, 2020    (JP) .............................. JP2020-000899

(51) Int. Cl.
*H03M 13/45*    (2006.01)
*H03M 13/11*    (2006.01)
*H03M 13/00*    (2006.01)

(52) U.S. Cl.
CPC ..... *H03M 13/458* (2013.01); *H03M 13/1108* (2013.01); *H03M 13/1125* (2013.01); *H03M 13/45* (2013.01); *H03M 13/6508* (2013.01)

(58) Field of Classification Search
CPC .......................... H03M 13/458; H03M 13/45
See application file for complete search history.

(56) References Cited

U.S. PATENT DOCUMENTS

| | | | |
|---|---|---|---|
| 7,644,336 B2 * | 1/2010 | Yang | H03M 13/1197 714/755 |
| 8,458,536 B2 | 6/2013 | Yang | |
| 8,625,347 B2 | 1/2014 | Sakurada | |
| 9,183,083 B2 | 11/2015 | Sakurada et al. | |
| 9,298,552 B2 | 3/2016 | Leem et al. | |
| 10,210,042 B2 | 2/2019 | Sakurada | |
| 2015/0188577 A1 * | 7/2015 | Ogawa | H03M 13/6337 714/759 |
| 2017/0139769 A1 * | 5/2017 | Blaichman | G11C 29/52 |
| 2019/0220348 A1 * | 7/2019 | Kokubun | G06F 11/1012 |
| 2020/0081770 A1 * | 3/2020 | Kumano | G06F 11/1068 |

FOREIGN PATENT DOCUMENTS

| | | |
|---|---|---|
| JP | 2013-80450 A | 5/2013 |
| JP | 5272212 B2 | 8/2013 |
| JP | 2019-125910 A | 7/2019 |

* cited by examiner

*Primary Examiner* — Joseph D Torres
(74) *Attorney, Agent, or Firm* — Oblon, McClelland, Maier & Neustadt, L.L.P.

(57) ABSTRACT

According to one embodiment, a decoding device comprises a converter configured to convert read data to first likelihood information by using a first conversion table, a decoder which decodes the first likelihood information, a controller which outputs a decoding result of the decoder when the decoder succeeds decoding, and a creator module which creates a second conversion table based on the decoding result when the decoder fails decoding. When the second conversion table is created, at least a part of the decoding result is converted to second likelihood information by using the second conversion table the second likelihood information is decoded.

12 Claims, 33 Drawing Sheets

| LLR conversion module 78 input | Condition (Number of decoding processes) | Data |
|---|---|---|
| Hard-bit data HB-in(n) | n=1 | HB |
| | n≥2 | HB-out(n-1) |
| Soft-bit data SB1-in(n) | All | SB1 |
| Soft-bit data SB2-in(n) | All | SB2 |
| Soft-bit data SB3-in(n) | All | SB3 |
| Soft-bit data SB4-in(n) | All | SB4 |
| LLR table LLR-in(n) | n=1 | LLR0 |
| | n≥2 | LLR-out(n-1) |

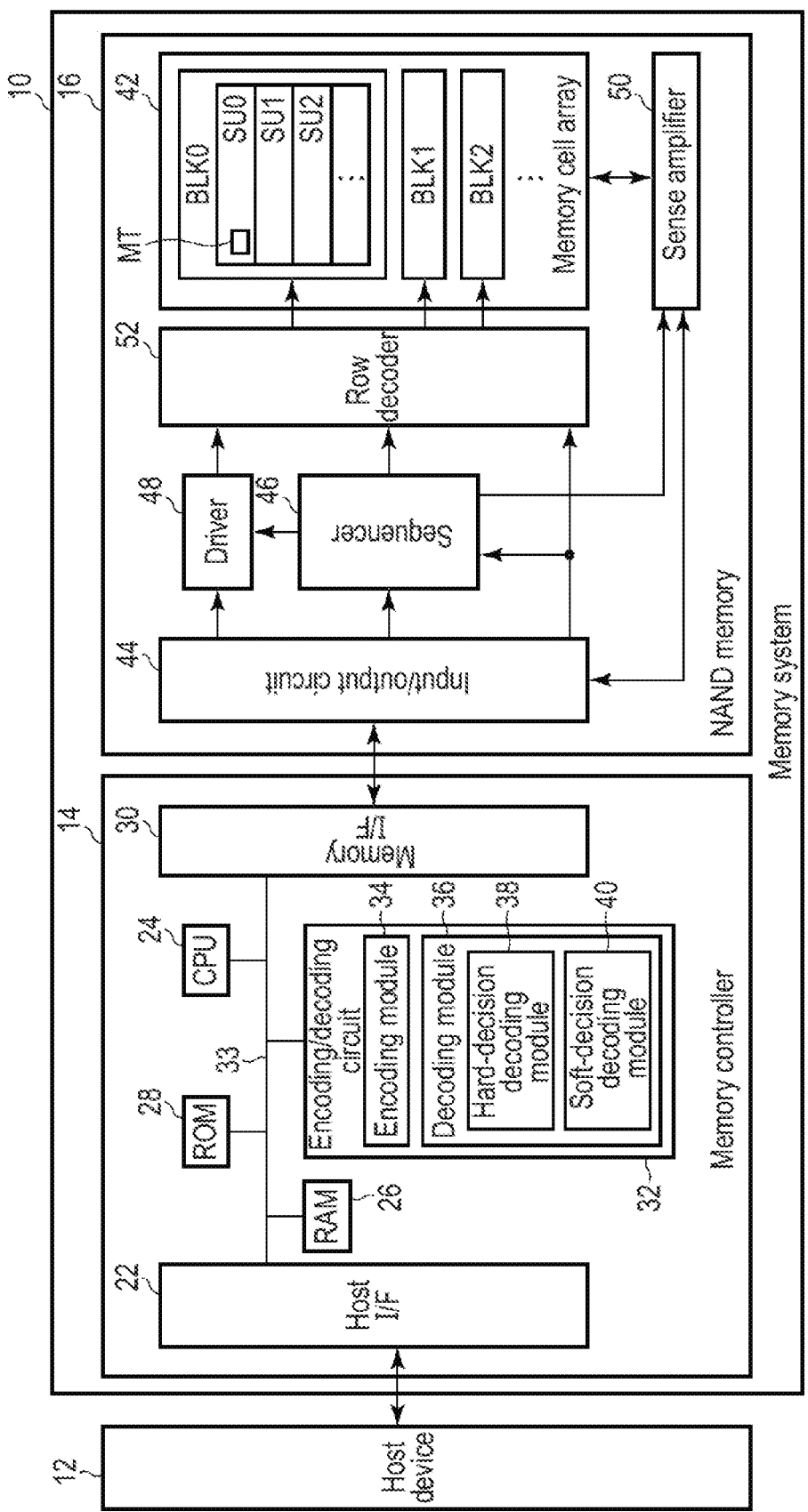
F I G. 1

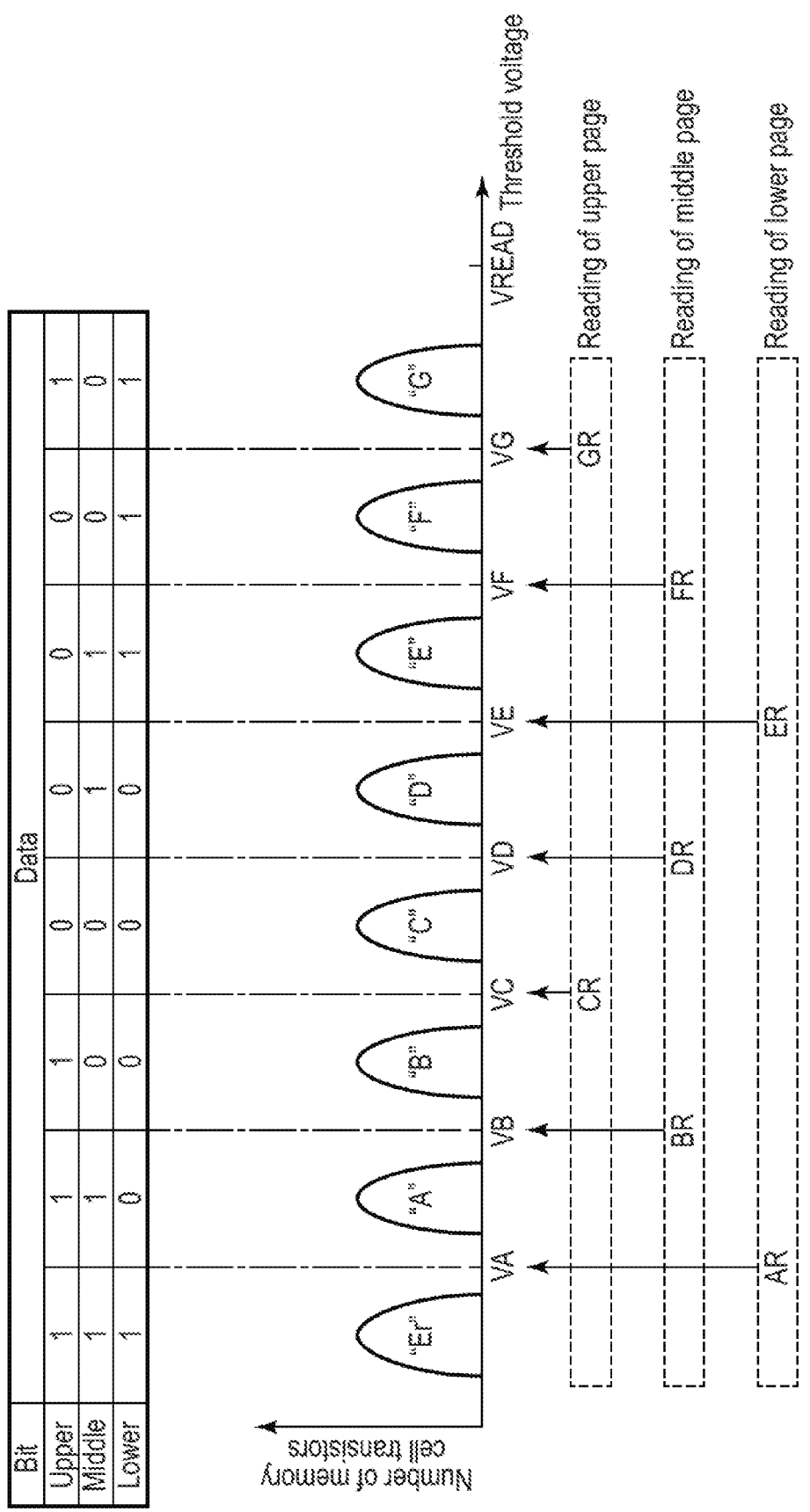
F I G. 3

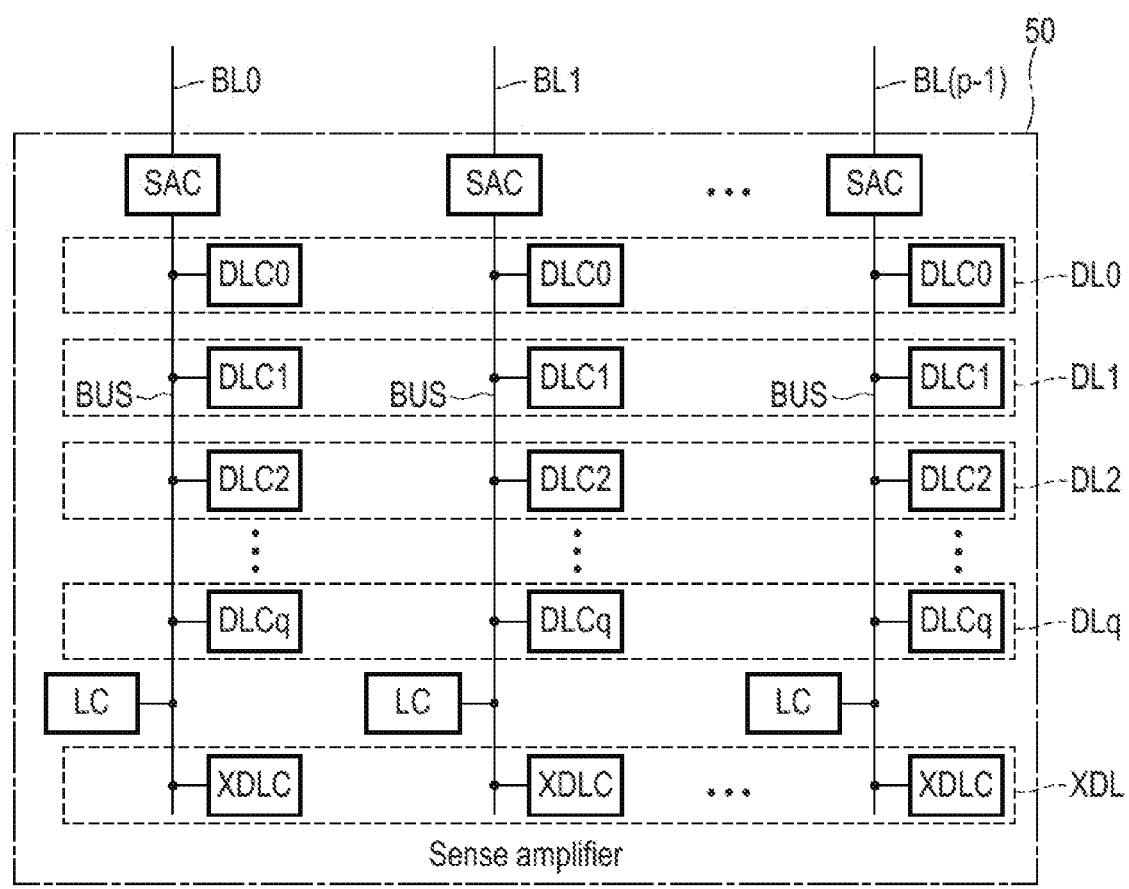
F I G. 4

| LLR label | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| LLR value | -9 | -5 | -3 | -1 | +1 | +3 | +5 | +8 | +9 | +9 | +8 | +5 | +3 | +1 | -1 | -3 | -5 | -8 | -9 | -9 |

F I G. 8

| LLR conversion module 78 input | Condition (Number of decoding processes) | Data |
|---|---|---|
| Hard-bit data HB-in(n) | n=1 | HB |
| | n≥2 | HB-out(n-1) |
| Soft-bit data SB1-in(n) | All | SB1 |
| Soft-bit data SB2-in(n) | All | SB2 |
| Soft-bit data SB3-in(n) | All | SB3 |
| Soft-bit data SB4-in(n) | All | SB4 |
| LLR table LLR-in(n) | n=1 | LLR0 |
| | n≥2 | LLR-out(n-1) |

FIG. 10

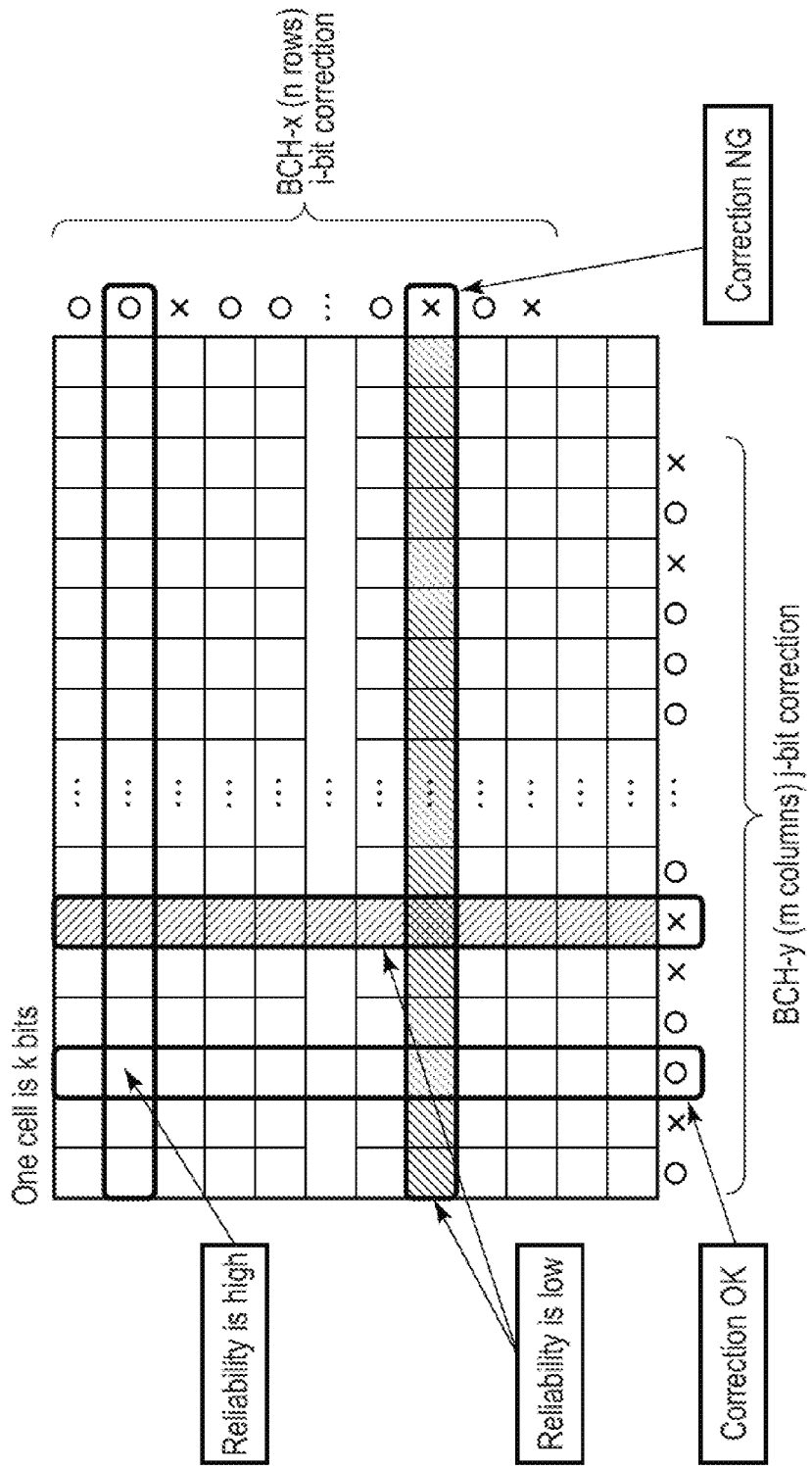
F I G. 18

(n−1)th decoding

| HB-in(n−1) (=HBα-out(n−2)) | 1 | 1 | 0 | 0 | 0 | 1 | 1 | 0 | 0 | 1 | 0 | 0 | 1 | ... | + LLR-in(n−1) (=LLR-out(n−2)) |

| HB-out(n−1) | 1 | 0 | 0 | 0 | 1 | 1 | 1 | 1 | 0 | 0 | 0 | 1 | ... |
|---|---|---|---|---|---|---|---|---|---|---|---|---|---|
| Syndrome operation result (correction OK/NG) | OK | | | | OK | NG | | | OK | | | NG | ... |
| Reliability | High | | | | High | Low | | | High | | | Low | ... | nth decoding

| HB-in(n) (=HBα-out(n−1)) | 1 | 0 | 0 | 0 | 1 | 1 | 1 | 1 | 0 | 0 | 0 | 1 | ... | + LLR-in(n) (=LLR-out(n−1)) |

| HB-out(n) | 1 | 0 | 0 | 0 | 0 | 1 | 1 | 1 | 0 | 0 | 0 | 1 | ... |
|---|---|---|---|---|---|---|---|---|---|---|---|---|---|
| Syndrome operation result (correction OK/NG) | OK | | | | OK | NG | | | | | | NG | ... |
| Reliability | High | | | | High | Low | | | | | | Low | ... |

F I G. 19

| DEC | BIN |
|---|---|
| -31 | 111111 |
| -30 | 111110 |
| -29 | 111101 |
| -28 | 111100 |
| -27 | 111011 |
| -26 | 111010 |
| -25 | 111001 |
| -24 | 111000 |
| -23 | 110111 |
| -22 | 110110 |
| ... | ... |
| -2 | 100010 |
| -1 | 100001 |
| 0 | 000000 |
| 1 | 000001 |
| 2 | 000010 |
| ... | ... |
| 22 | 010110 |
| 23 | 010111 |
| 24 | 011000 |
| 25 | 011001 |
| 26 | 011010 |
| 27 | 011011 |
| 28 | 011100 |
| 29 | 011101 |
| 30 | 011110 |
| 31 | 011111 |

FIG. 20

(n-1)th decoding

| HB-in(n-1) (=HBα-out(n-2)) | 1 | 1 | 0 | 0 | 1 | ... | 0 | 0 | 1 | 1 | 0 | ... |
|---|---|---|---|---|---|---|---|---|---|---|---|---|
| LLR-in(n-1) (=LLR-out(n-2)) | -9 | -6 | +4 | +4 | -1 | ... | +9 | +6 | -1 | -9 | +1 | ... |
| Posterior value (n-1) | -10 | 31 | 1 | -8 | 12 | ... | 25 | -27 | -6 | 19 | -2 | ... |
| Reliability | Low | High | Low | Low | Low | ... | High | High | Low | Low | Low | ... |
| HB-out(n-1) | 1 | 0 | 0 | 1 | 0 | ... | 0 | 1 | 1 | 0 | 1 | ... |
| HBα-out(n-1) | 1 | 0 | 0 | 0 | 1 | ... | 0 | 1 | 1 | 1 | 0 | ... | nth decoding

| HB-in(n) (=HBα-out(n-1)) | 1 | 0 | 0 | 0 | 1 | ... | 0 | 1 | 1 | 1 | 0 | ... |
|---|---|---|---|---|---|---|---|---|---|---|---|---|
| LLR-in (=LLR-out(n-1)) | -7 | +5 | +3 | -1 | 1 | ... | +7 | -6 | -1 | -9 | +1 | ... |
| Posterior value (n) | -15 | -29 | 8 | -27 | -15 | ... | 28 | -14 | -18 | 25 | -3 | ... |
| Reliability | Low | High | Low | High | Low | ... | High | Low | Low | High | Low | ... |
| HB-out(n) | 1 | 1 | 1 | 0 | 0 | ... | 0 | 1 | 1 | 0 | 1 | ... |
| True HB | 1 | 1 | 1 | 0 | 0 | ... | 0 | 1 | 1 | 0 | 1 | ... |

F I G. 21

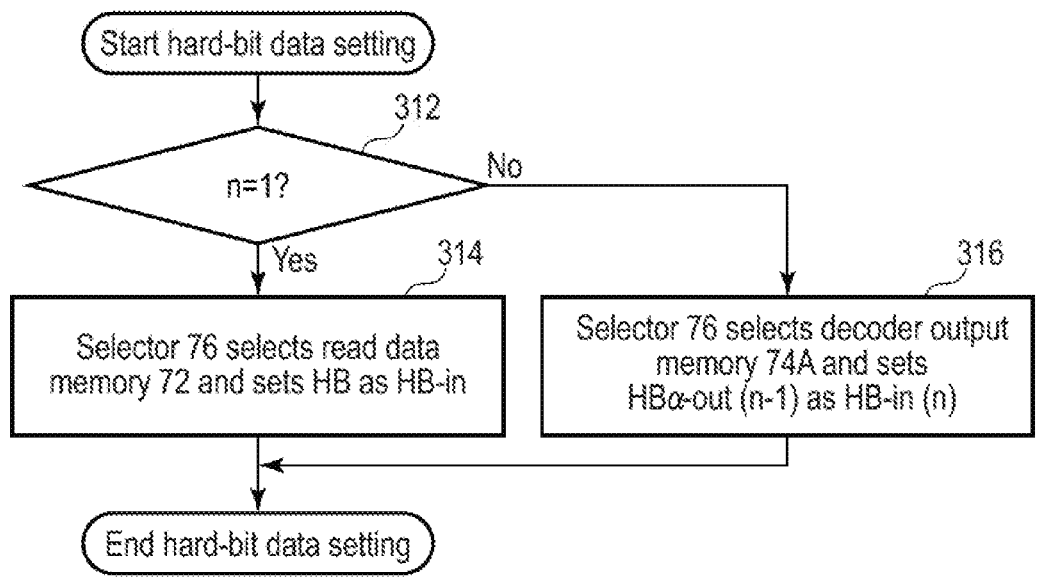
F I G. 23
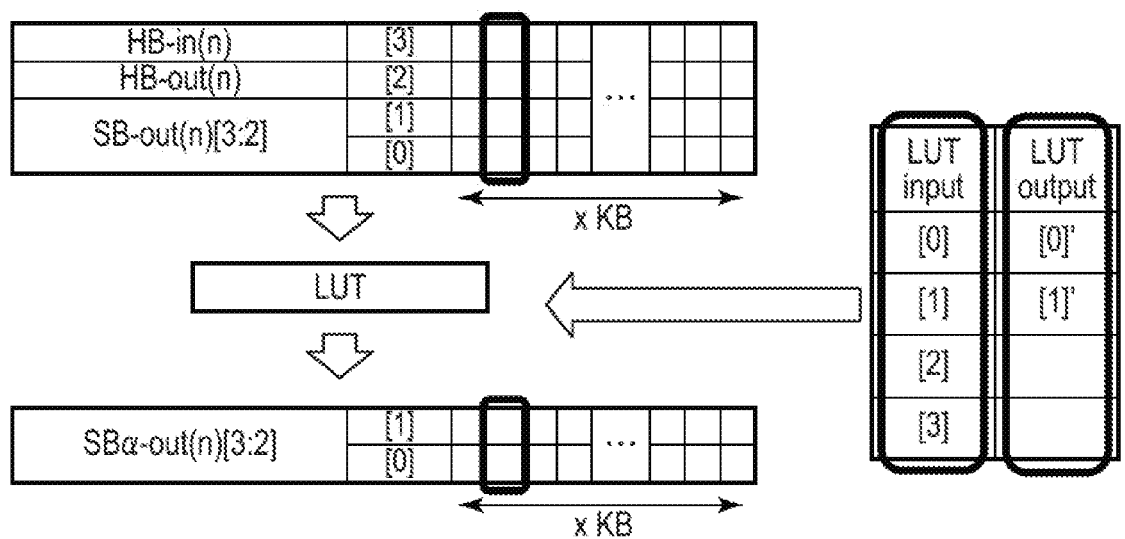
F I G. 24

| LUT input [3:0] | LUT output [1:0] |
|---|---|
| 0000 | 00 |
| 0001 | 01 |
| 0010 | 10 |
| 0011 | 11 |
| 0100 | 00 |
| 0101 | 01 |
| 0110 | 10 |
| 0111 | 01 |
| 1000 | 00 |
| 1001 | 01 |
| 1010 | 10 |
| 1011 | 01 |
| 1100 | 00 |
| 1101 | 01 |
| 1110 | 10 |
| 1111 | 11 |

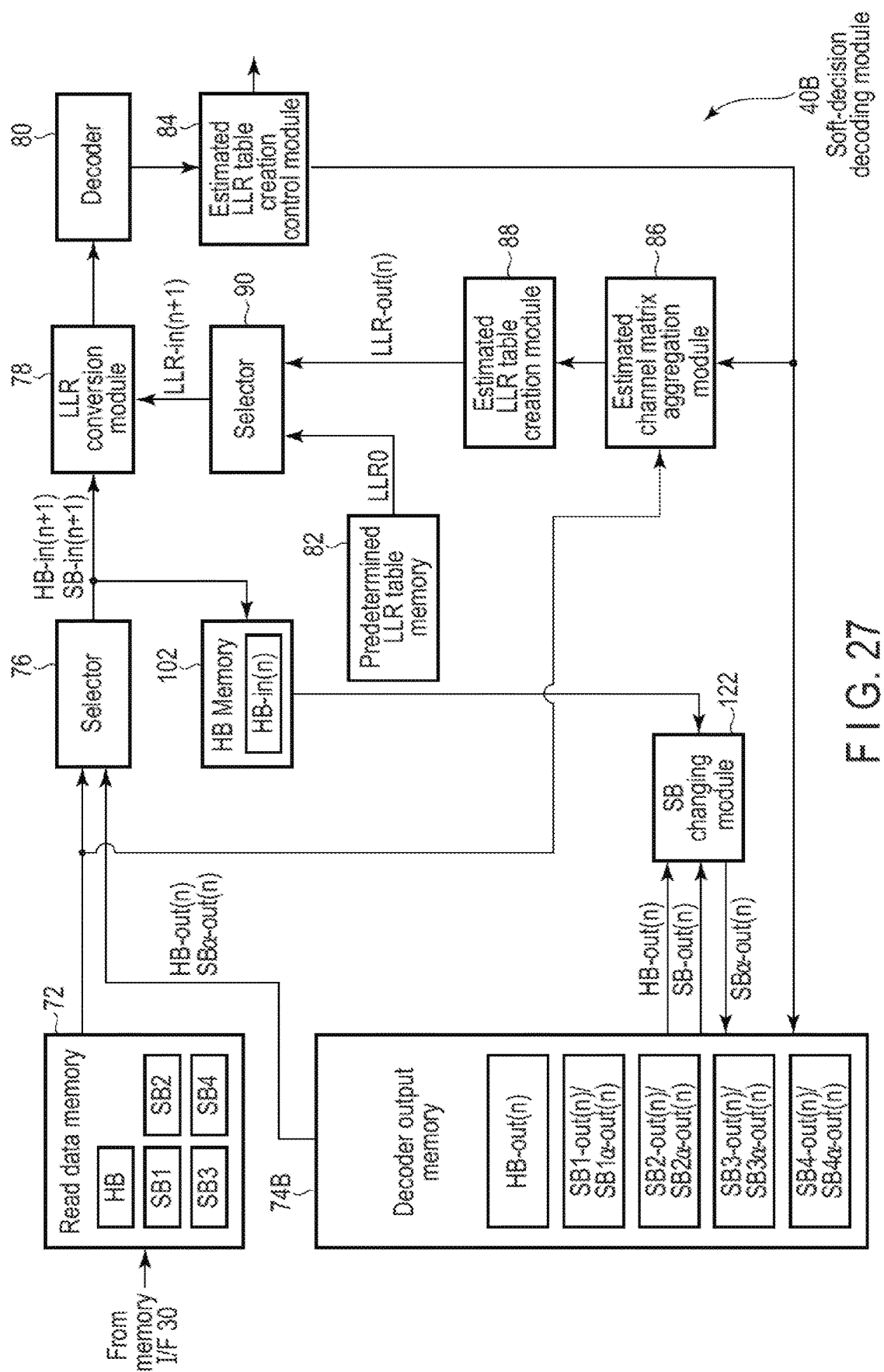
F I G. 27

| LLR value (DEC) | BIN |
|---|---|
| -15 | 11111 |
| -14 | 11110 |
| -13 | 11101 |
| -12 | 11100 |
| -11 | 11011 |
| -10 | 11010 |
| -9 | 11001 |
| -8 | 11000 |
| -7 | 10111 |
| -6 | 10110 |
| -5 | 10101 |
| -4 | 10100 |
| -3 | 10011 |
| -2 | 10010 |
| -1 | 10001 |
| 0 | 00000 |
| 1 | 00001 |
| 2 | 00010 |
| 3 | 00011 |
| 4 | 00100 |
| 5 | 00101 |
| 6 | 00110 |
| 7 | 00111 |
| 8 | 01000 |
| 9 | 01001 |
| 10 | 01010 |
| 11 | 01011 |
| 12 | 01100 |
| 13 | 01101 |
| 14 | 01110 |
| 15 | 01111 |

FIG. 31

| Index (DEC) | LUT input [6:0] | LUT output [4:0] |
|---|---|---|
| 0 | 0000000 | 00000 |
| 1 | 0000001 | 00001 |
| 2 | 0000010 | 00010 |
| ... | ... | ... |
| 39 | 0100111 | 00111 |
| 40 | 0101000 | 00001 |
| 41 | 0101001 | 00001 |
| 42 | 0101010 | 01010 |
| ... | ... | ... |
| 55 | 0110111 | 10111 |
| 56 | 0111000 | 10001 |
| 57 | 0111001 | 10001 |
| 58 | 0111010 | 11010 |
| ... | ... | ... |
| 71 | 1000111 | 00111 |
| 72 | 1001000 | 00001 |
| 73 | 1001001 | 00001 |
| 74 | 1001010 | 01010 |
| ... | ... | ... |
| 87 | 1010111 | 10111 |
| 88 | 1011000 | 10001 |
| 89 | 1011001 | 10001 |
| 90 | 1011010 | 11010 |
| ... | ... | ... |
| 126 | 1111110 | 11110 |
| 127 | 1111111 | 11111 |

F I G. 32

• After first decoding
LLR-out (1) creation

| HB/SB1/SB2 | 111 | 110 | 100 | 101 | 001 | 000 | 010 | 011 |
|---|---|---|---|---|---|---|---|---|
| LLR | -8 | -4 | -3 | -1 | +2 | +4 | +6 | +8 |
| Write 1 | | | | | | | | A |
| Write 0 | B | | | | | | | |

A  Change LLR value in A to +1
B  Change LLR value in B to -1

⟹ LLRα-out (1) creation = LLR-in (2)

• After second decoding
LLR-out (2) creation

| HB/SB1/SB2 | 111 | 110 | 100 | 101 | 001 | 000 | 010 | 011 |
|---|---|---|---|---|---|---|---|---|
| LLR | -8 | -5 | -3 | -1 | +1 | +3 | +6 | +9 |
| Write 1 | | | | | | | | A |
| Write 0 | B | | | | | | | |

A  Change LLR value in A to +2
B  Change LLR value in B to -2

⟹ LLRα-out (2) creation = LLR-in (3)

• After third decoding
LLR-out (3) creation

| HB/SB1/SB2 | 111 | 110 | 100 | 101 | 001 | 000 | 010 | 011 |
|---|---|---|---|---|---|---|---|---|
| LLR | -9 | -6 | -4 | -2 | +1 | +3 | +6 | +9 |
| Write 1 | | | | | | | | A |
| Write 0 | B | | | | | | | |

A  Change LLR value in A to +3
B  Change LLR value in B to -3

⟹ LLRα-out (3) creation = LLR-in (4)

F I G. 33

| Index (DEC) | LUT input [6:0] | LUT output [4:0] |
|---|---|---|
| 0 | 0000000 | 00000 |
| 1 | 0000001 | 00001 |
| 2 | 0000010 | 00010 |
| ... | ... | ... |
| 39 | 0100111 | 00111 |
| 40 | 0101000 | 00010 |
| 41 | 0101001 | 00010 |
| 42 | 0101010 | 01010 |
| ... | ... | ... |
| 55 | 0110111 | 10111 |
| 56 | 0111000 | 10010 |
| 57 | 0111001 | 10010 |
| 58 | 0111010 | 11010 |
| ... | ... | ... |
| 71 | 1000111 | 00111 |
| 72 | 1001000 | 00010 |
| 73 | 1001001 | 00010 |
| 74 | 1001010 | 01010 |
| ... | ... | ... |
| 87 | 1010111 | 10111 |
| 88 | 1011000 | 10010 |
| 89 | 1011001 | 10010 |
| 90 | 1011010 | 11010 |
| ... | ... | ... |
| 126 | 1111110 | 11110 |
| 127 | 1111111 | 11111 |

FIG. 34A

| Index (DEC) | LUT input [6:0] | LUT output [4:0] |
|---|---|---|
| 0 | 0000000 | 00000 |
| 1 | 0000001 | 00001 |
| 2 | 0000010 | 00010 |
| ... | ... | ... |
| 39 | 0100111 | 00111 |
| 40 | 0101000 | 00011 |
| 41 | 0101001 | 00011 |
| 42 | 0101010 | 01010 |
| ... | ... | ... |
| 55 | 0110111 | 10111 |
| 56 | 0111000 | 10011 |
| 57 | 0111001 | 10011 |
| 58 | 0111010 | 11010 |
| ... | ... | ... |
| 71 | 1000111 | 00111 |
| 72 | 1001000 | 00011 |
| 73 | 1001001 | 00011 |
| 74 | 1001010 | 01010 |
| ... | ... | ... |
| 87 | 1010111 | 10111 |
| 88 | 1011000 | 10011 |
| 89 | 1011001 | 10011 |
| 90 | 1011010 | 11010 |
| ... | ... | ... |
| 126 | 1111110 | 11110 |
| 127 | 1111111 | 11111 |

FIG. 34B

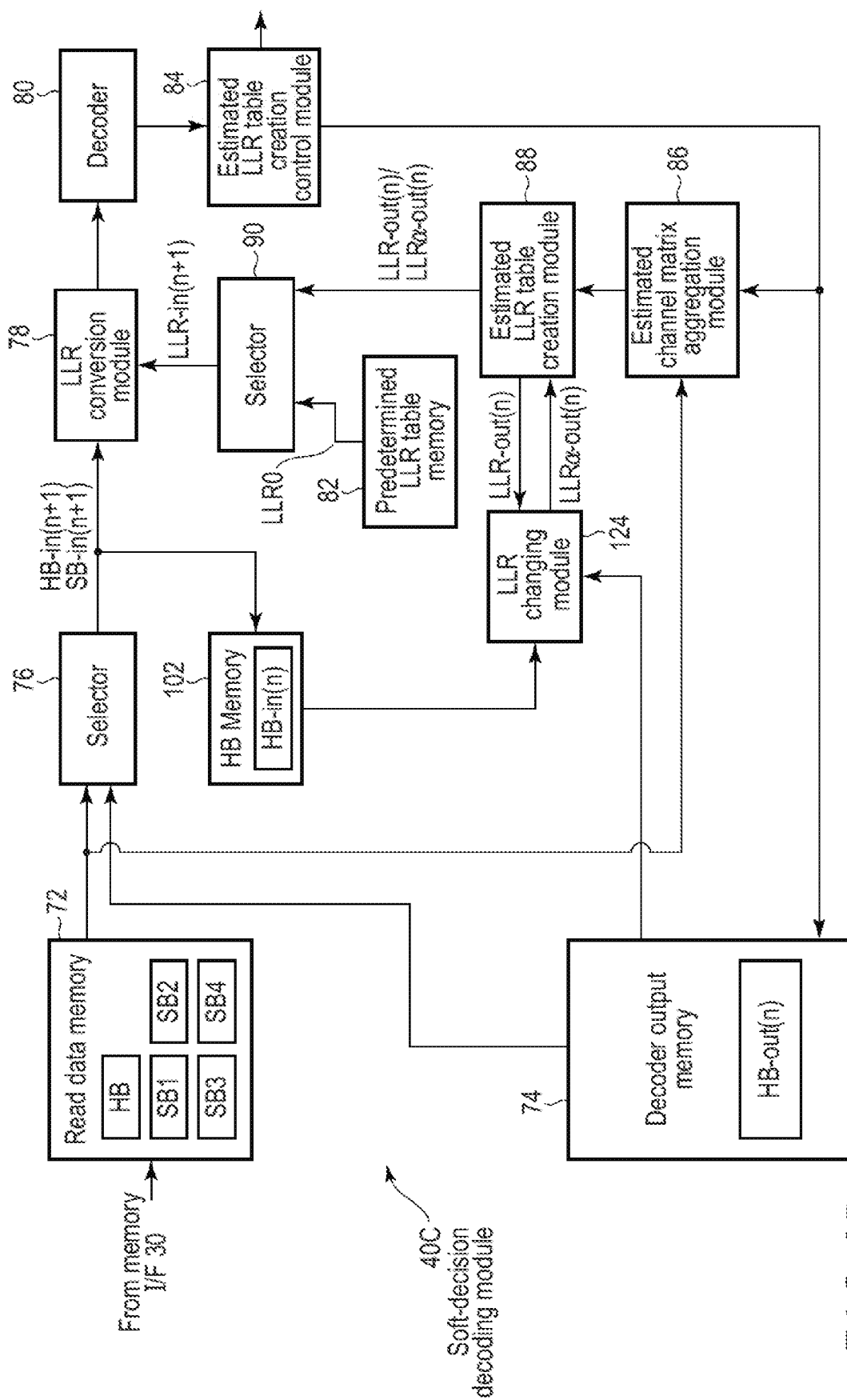
F I G. 35

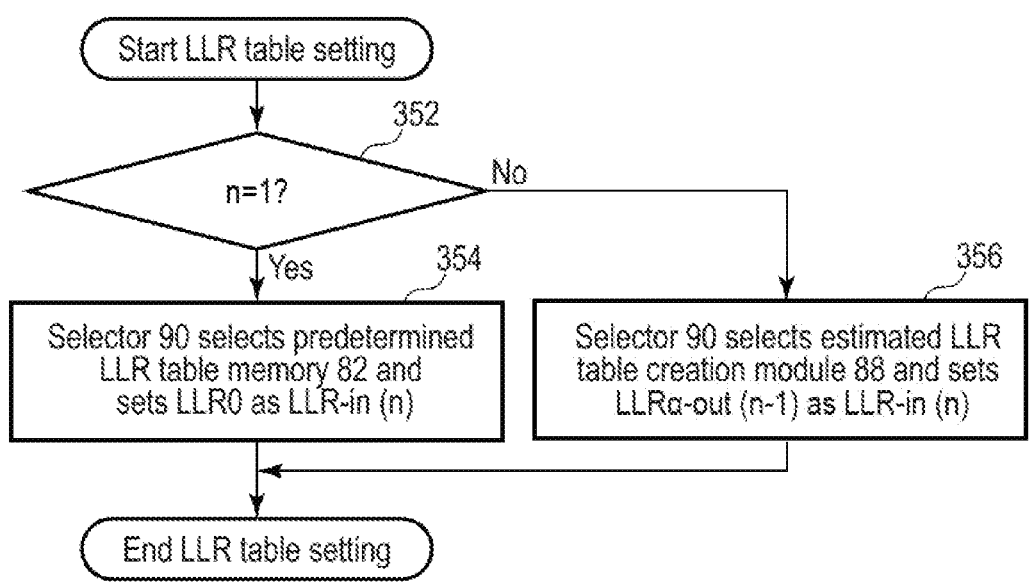
F I G. 37

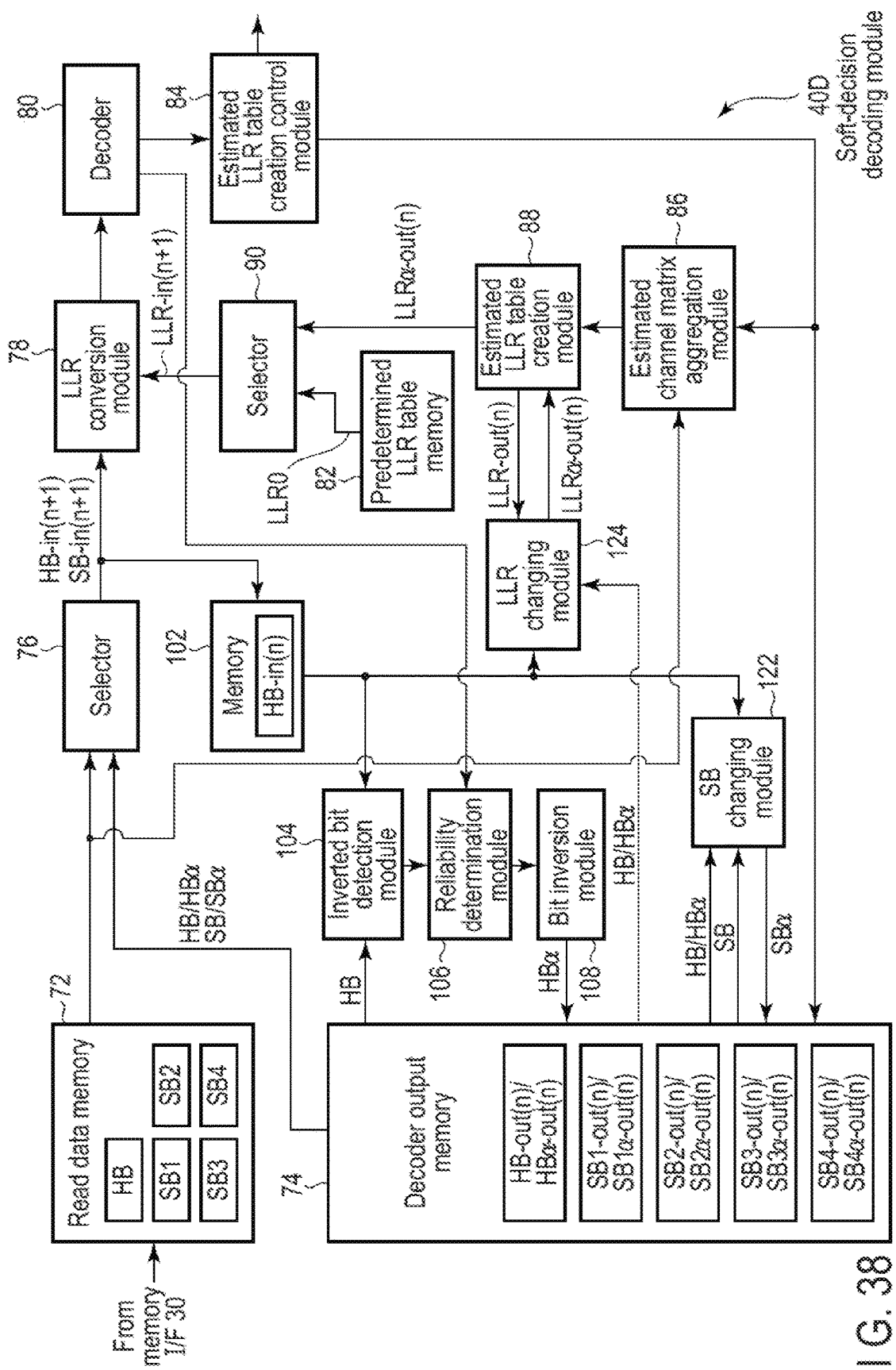
F I G. 38

DECODING DEVICE AND DECODING METHOD

CROSS-REFERENCE TO BELATED APPLICATIONS

This application is based upon and claims the benefit of priority from Japanese Patent Application No. 2020-000899, filed Jan. 7, 2020, the entire contents of which are incorporated herein by reference.

FIELD

Embodiments described herein relate generally to a decoding device and a decoding method.

BACKGROUND

In a storage device including a nonvolatile memory such as a NAND type flash memory, from the perspective of data protection, stored data is generally encoded. Therefore, when stored data is read, encoded data is decoded.

Examples of the method of reading data from the nonvolatile memory include a hard-decision reading method and a soft-decision reading method. In a case where each memory cell of the nonvolatile memory is a single-level cell (SLC) which stores one-bit data, in the hard-decision reading method, data stored in each memory cell is read as a bit "0" or a bit "1". In the soft-decision reading method, data stored in each memory cell is read as information about the probability of data being "0" or "1". As the information about the probability, a log-likelihood ratio (LLR) is generally used. An LLR value is information expressing the probability of stored bit being 0 and the probability of stored bit being 1 as a logarithmic ratio. In the soft-decision reading method, read data of the nonvolatile memory is converted to a sequence of LLR values according to a table called an LLR table created beforehand, and the sequence of LLR values is subjected to soft-decision decoding processing.

Since the LLR table is a table showing the LLR value for the read data of each memory cell, if the threshold voltage of the memory cell changes and the read data changes, the read data cannot be correctly converted to the LLR value. That is, when the assumed threshold voltage distribution in the LLR table and the actual threshold voltage distribution of the memory cells match, the soft-decision decoding achieves high error correction performance and hardly fails in decoding. However, the threshold voltage distribution of the memory cells changes due to various causes, and high error correction performance of the soft-decision decoding cannot be maintained. When the threshold voltage distribution of the memory cells fluctuates, the error correction performance decreases, and the soft-decision decoding fails in some cases.

BRIEF DESCRIPTION OF THE DRAWINGS

FIG. 1 is a block diagram showing an example of a memory system including a decoding device according to the first embodiment.

FIG. 3 is an illustration showing an example of the relationship between the threshold voltage distribution of memory cells and stored data, FIG. 4 is a block diagram showing an example of a sense amplifier.

FIG. 8 is an illustration showing an example of an LLR table.

FIG. 10 is an illustration showing an example of the operation of a selector which supplies hard-bit-data and soft-bit data to an LLR conversion module and the operation of a selector which supplies an LLR table to the LLR conversion module.

FIG. 18 is an illustration showing an example of a hard-bit data decoding result.

FIG. 19 is an illustration for explaining an example of the operation of the soft-decision decoding module.

FIG. 20 is an illustration showing an example of a mapping table of posterior values of LLR operation results.

FIG. 21 is an illustration for explaining another example of the operation of the soft-decision decoding module.

FIG. 23 is a flowchart showing an example of hard-bit data setting.

FIG. 24 is an illustration showing an example of soft-bit data change according to the third embodiment.

FIG. 27 is a block diagram showing an example of a soft-bit de coding module.

FIG. 31 is an illustration showing an example of a mapping table of LLR tables.

FIG. 32 is an illustration showing an example of a lookup table for LLR table change.

FIG. 33 is an illustration for explaining another example of LLR table change.

FIG. 34A is an illustration showing another example of the lookup table for LLR table change.

FIG. 34B is an illustration showing another example of the lookup table for LLR table change.

FIG. 35 is a block diagram shewing an example of a soft-decision decoding module.

FIG. 37 is a flowchart shewing an example of LLR table setting.

FIG. 38 is a block diagram showing an example of a soft-decision decoding module according to the fifth embodiment.

DETAILED DESCRIPTION

Figure 2:
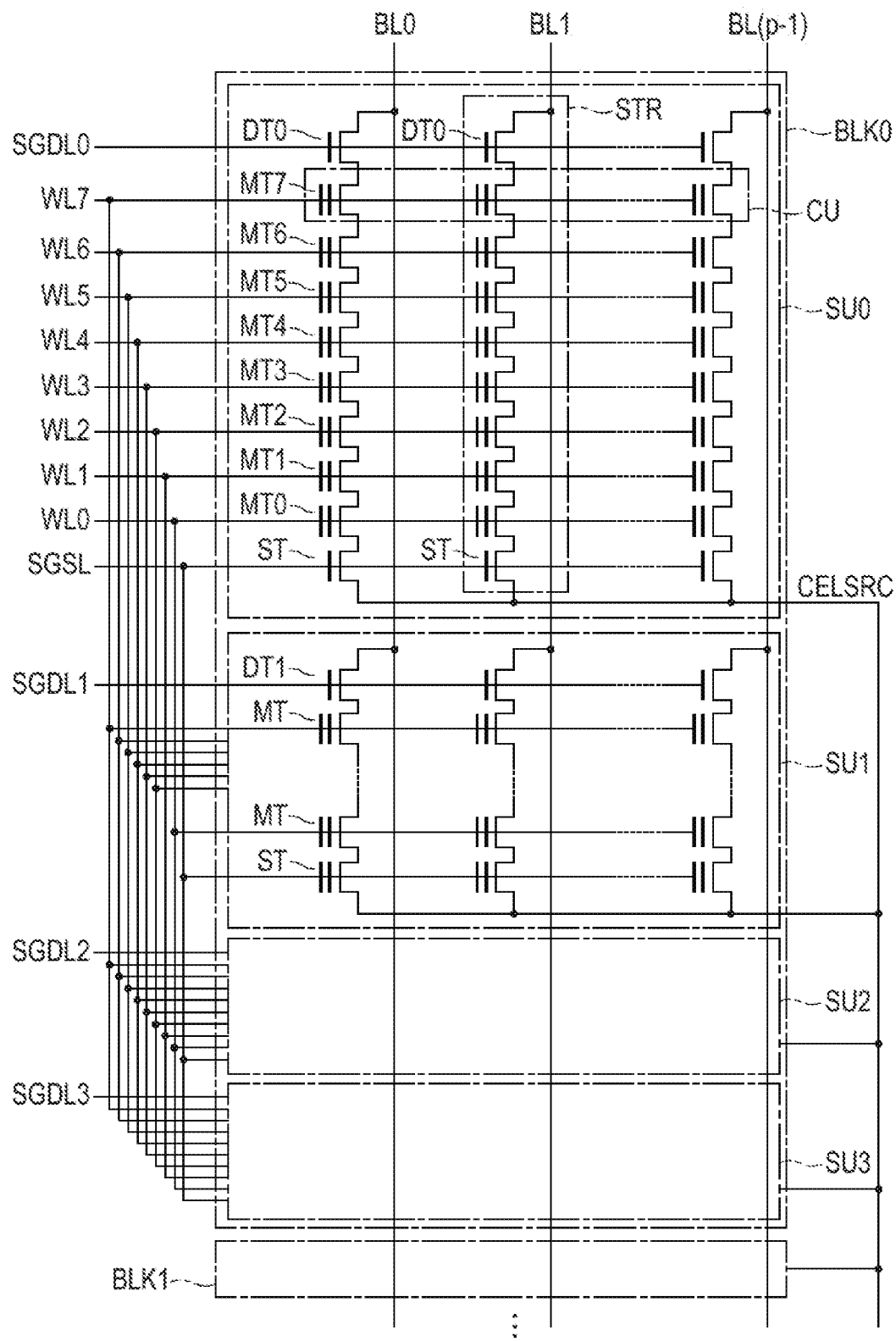
FIG. 2 is an illustration showing an example a memory cell array.

Embodiments will be described hereinafter with reference to the accompanying drawings. The following descriptions are intended to illustrate devices and methods which implement the technical ideas of the embodiments. The technical ideas of the embodiments are not limited to the structures, shapes, arrangements, materials and the like of constituent elements which will be described below. Modifications, which are easily conceivable by a person of ordinary skill in the art, come within the scope of the disclosure as a matter of course. In order to make the descriptions clearer, the sizes, thicknesses, planar dimensions, shapes and the like of the respective elements may be changed from those which are actually implemented and may be schematically illustrated in the drawings. The relationship of dimensions or the ratio of elements may vary in the drawings. In the drawings, the corresponding elements may be denoted by the same reference numbers, and the explanations of them which are considered redundant may be omitted. Some elements may be referred to by a plurality of names, but these names are merely examples, and these elements may be referred to by other names. In addition, the other elements, which are not referred to by a plurality of names, may also be referred to by other names. Note that, "connect" in the following descriptions means not only direct connect but also indirect connect via another element.

In general, according to one embodiment, there is provided a decoding device including a converter which converts data read from a nonvolatile memory to first likelihood information by using a first conversion table, a decoder which decodes the first likelihood information, a controller which outputs a decoding result of the decoder when the decoder succeeds in decoding the first likelihood information, and a creator which creates a second conversion table based on the decoding result when the decoder fails in decoding the first likelihood information. When the creator creates the second conversion table, the converter converts at least a part of the decoding result to second likelihood information by using the second conversion table, and the decoder decodes the second likelihood information.

First Embodiment (General Description of Nonvolatile Memory)

Before the decoding device of the embodiment is explained, decoding failure will be explained.

In a memory cell of a nonvolatile memory, each time writing and reading are executed, electrons penetrate an oxide film, which is an insulator. Therefore, as the number of write operations and the number of read operations increase, the oxide film deteriorates. Recently, in order to achieve high storage density, the size of the memory ceil has been miniaturized, and the amount of electrons stored in a charge storage layer has been reduced. An example of the charge storage layer is a floating gate. Therefore, the influence of interfering noise between memory ceils adjacent to each other has been increased. In some cases, when data is written (or programmed) into a memory ceil or read from a memory cell, data in an adjacent memory cell changes.

Data is programmed into a memory cell selected by, for example, a word line and a bit line. Simultaneously, an unselected memory cell also turns to a weak-programmed state, and as a result, a "program disturb phenomenon" occurs, that is, the threshold voltage of the selected memory cell increases. In addition, when data is read from a selected memory cell, an unselected memory cell turns to a weak-programmed state, and a "read disturb phenomenon" occurs, that is, the threshold voltage of the selected memory ceil increases.

On the other hand, if data written in a memory cell is not accessed for a long time, electrons are gradually discharged from the charge storage layer of the memory cell, and a "data retention phenomenon" occurs, that, is, the threshold voltage decreases. In addition, a situation where there is a difference between a temperature at a time of write operation and a temperature at a time of read operation is called a "temperature cross", and when a "temperature cross" occurs, the reliability of data decreases.

When a "program disturb phenomenon", a "read disturb phenomenon" or a "data retention phenomenon" occurs and the threshold voltage changes, the number of read errors increases, decoding fails, and the reliability of the nonvolatile memory decreases. In the soft-decision decoding, when an LLR table conforming to the threshold voltage distribution of memory cells is used, correction performance increases. Therefore, a plurality of LLR tables conforming to typical threshold voltage distributions in a case where a "program disturb phenomenon", a "read disturb phenomenon" or a "data retention phenomenon" occurs are created beforehand, and are stored in the nonvolatile memory. When decoding fails with a certain LLR table, the LLR table is switched to another LLR table according to the variation of the threshold voltage distribution, an LLR value is obtained by using the other LLR table, and soft-decision decoding is executed again.

However, the number of LLR tables stored in the nonvolatile memory, and the number of soft-decision decoding processes executed by switching the LLD table are limited. Therefore, all phenomena which cause decoding failure cannot be handled. Some threshold voltage variation phenomena cause decoding failure.

In order to prevent decoding failure, a technology called dynamic LLR estimation (DLE) has been developed. In this technology, a channel matrix is created by counting processing for decoded data and data to be corrected, that is, data read from the nonvolatile memory, and an LLR table is created from the channel matrix. Data written in the nonvolatile memory is known only if an error is corrected by a decoder and soft-decision decoding succeeds. Therefore, if decoding fails, in principle, DLE cannot be executed.

However, even when decoding fails, if an LLR table is newly created by DLE, in some cases, an LLR table which is more accurate than the LLR table created by the first DLE can be created. The creation of a new LLR table by DLE when decoding fails will be referred to as dynamic LLR estimation 2 (DLE2).

If soft-decision decoding is executed again using the LLR table created by DLE2 and decoding fails, by executing DLE2 again, an LLR table which is more accurate than the LLR table created by the first DLE2 can be created. By repeating soft-decision decoding using an LLR table newly created by DLE2, the number of error bits decreases, and the decoding success rate increases.

However, in DLE2, when soft-decision decoding is repeated by creating an LLR table, the LLR table is updated in the second decoding, but data to be decoded which is data to be subjected error correction is still the same as data read from the nonvolatile memory. Although some error bits are corrected in the failed, first decoding, the correction result is not reflected in the second decoding. That is, the same read data of the nonvolatile memory is decoded every time. Therefore, all error bits contained in an error correction code (ECC) frame need to be corrected in one decoding, and the possibility of decoding failure cannot be reduced.

In general, when decoding processing is executed, even though error correction does not succeed, the number of error bits decreases or the number of bits which cannot be easily corrected by error correction decreases. Therefore, in the first embodiment, when decoding is repeated by creating an LLR table by DLE2, a decoding result in which the number of error bits is reduced in the first decoding will be reflected in the second decoding. Accordingly, the number of initial error bits can be reduced, and the possibility of decoding failure can be reduced.

Definitions of Terms

Channel (referred to also as Stress): A channel is a probability model representing the influence of noise on a write value (referred to also as a transmit value) x and is characterized by a channel matrix. The nonvolatile memory corresponds to the channel, data written into the nonvolatile memory corresponds to the write value x. Factors affecting the characteristics of the channel matrix are considered to be a "program disturb phenomenon", a "data retention phenomenon", a read disturb phenomenon", a "temperature cross" and the like.

Likelihood: A likelihood is a conditional probability $P(y|x)$ of an output value of a channel (referred to also as a receive value) y being obtained when a certain write value x is given. The histogram of all sets (x, y) is the channel matrix. The error correction decoding result on the read data of the nonvolatile memory corresponds to the output value y.

Log-likelihood Ratio (LLR): An LLR (referred to also as likelihood information) is information expressing the likelihood of the write value x being "0" and the likelihood of the write value x being "1" as a logarithmic ratio.

LLR Table: An LLR table is a table showing the correspondence relationship between the output value y of the channel and the LLR value supplied to the decoder. A value ln $[P(y|x=0)/P(y|x=1)]$ obtained from the channel matrix is an LLR value corresponding to the output value y. In general, different LLR tables are prepared for different channels.

In addition, the LLR table defines an LLR value for a combination of bits related to each other in hard-bit data and soft-bit data. Therefore, by referring to the LLR table, one LLR value corresponding to the combination of bits can be obtained. Each combination of bits is called an LLR label. Each LLR value indicates the likelihood of the value ("0" or "1") of a hard-bit related to the LLR value. A plurality of LLR tables for a plurality of different states of the threshold voltage distribution of the nonvolatile memory may be set before shipment.

Predetermined LLR Table: A predetermined LLR table is an LLR table used as a default. An LLR table of a channel which is considered to be typically used may be used as the predetermined LLR table. For example, the predetermined LLR table may be calculated by a mathematical formula based on the assumption that the read voltage distribution of the memory cells is a normal distribution in each write state at a timing when the read data is changed from "1" to "0" or changed in the other way. An LLR table created based on an experiment in which a typical stress is given to the NAND may be used as the predetermined LLR table.

ECC Frame: An ECC frame is a unit of data when the decoder reconstructs a code word from a series of output values y of the channel.

Estimated Write Value of Decoding Result (referred to also as Estimate Value) k: An estimate value k is each estimated write value which is the output of the decoder. Therefore, at the end of decoding, a series {k} of estimated write values k corresponding to an ECO is obtained. Note that decoding success means that a series {x} of write values which is a correct answer and a series {k} of decoding results perfectly match. On the other hand, decoding failure means that x≠k in a part of an ECC frame and a series {x} and a series {k} do not match.

True Channel Matrix: A true channel matrix is a channel matrix composed of a conditional probability $P(y|x)$ based on a write value x which is a correct answer.

Estimated Channel Matrix: An estimated channel matrix is a channel matrix composed of a conditional probability $P(y|k)$ based on an estimated write value k output from the decoder.

Estimated LLR Table: An estimated LLR table is an LLR table based on the estimate channel matrix.

Hard-bit data: Hard-bit data is data read from a page to be read (selected page) in a cell unit to be read (selected ceil unit) CU by lower page reading, middle page reading or upper page reading (described later). Hard-bit data has the size of, for example, one page, and includes a sequence of bits (hard-bits) based on the result of reading of data from each ceil transistor (selected cell transistor) MT in a selected ceil unit CU.

Soft-bit data: Soft-bit data also includes a sequence of soft-bits, and each soft-bit indicates information about one selected ceil transistor MT. Soft-bit data includes various types based on the details of the operation. In each bit, soft-bit data indicates the result of the logical operation of a plurality of sequences of bits read under different conditions from a selected cell transistor MT corresponding to the bit. The details of hard-bit data and soft-bit data will be described later.

Figure 5:
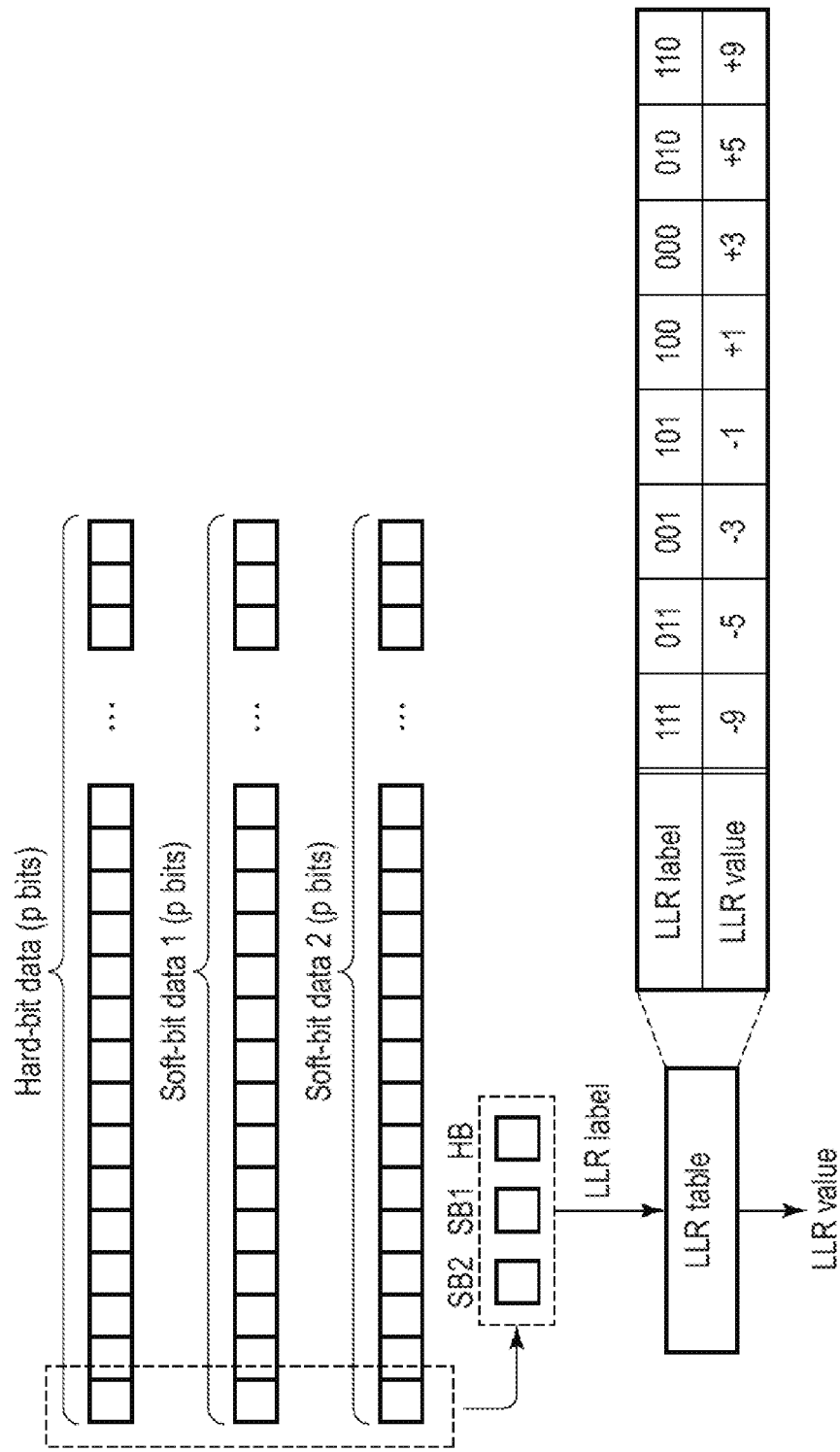
FIG. 5 is an illustration showing an example of hard-bit data, soft-bit data, an LLR label, and an LLR value.

FIG. 5 shows an example of the hard-bit data, the soft-bit data, the LLR label, and the LLR value. Although the embodiment can include many types of soft-bit data, for the sake of convenience of explanation, FIG. 5 shows the case of two soft-bit data, that is, soft-bit data SB1 and soft-bit data SB2. Each of horizontally arranged ceils indicates one bit in hard-bit data HB, the soft-bit data SB1, and the soft-bit data SB2. Vertically arranged cells are the bits of one selected ceil transistor MT. The hard-bit data HB having the size of one page includes p bits, that is, the same number of bits as the number p of the ceil transistors MT in one ceil unit CU. Similarly, each of the soft-bit data SB1 and the soft-bit data SB2 includes p bits.

Soft-bit data includes a sequence of bits (soft-bits) based an data read under different conditions from each cell transistor MT of a selected page. Each soft-bit is information about one selected cell transistor MT, and is used for obtaining the LLR value of the hard-bit of the selected cell transistor MT.

The bits in the hard-bit data HB, the soft-bit data SB1 and the soft-bit data SB2 of one selected cell transistor MT constitute one set. One set includes three-bit data, and corresponds to the value of one LLR label. Different, combinations of the three-bit set correspond to different LLR labels. Each LLR value is a positive or negative value. Here, for the sake of convenience of explanation, the LLR value is expressed by a decimal number.

(Soft-Decision Decoding)

In order to explain the principle of soft-decision decoding, the relationship between "estimation of a channel required for soft-decision decoding" and "an LLR table" will be explained. Note that, in the following explanation, for the sake of simplicity, the transmit value x is assumed to take 0 and 1 and the receive value y is assumed to take 0, 1, 2 and 3.

In soft-decision decoding, when a channel to be decoded is determined, a transmit value x written into the NAND memory 16 is recorded, and a receive value y to which the transmit value x read from the NAND memory 16 is changed is also recorded, and a histogram shown in Table 1 is obtained. Table 1 shows an example of the channel matrix.

TABLE 1

|       | y = 0 | y = 1 | y = 2 | y = 3 |
|-------|-------|-------|-------|-------|
| x = 0 | 1     | 125   | 729   | 2197  |
| x = 1 | 3375  | 1331  | 343   | 27    |

The histogram of Table 1 shows that, as a result of 8128 observations, a set (x=0, y=0) is observed once, a set (x=1, y=0) is observed 3375 times, a set (x=0, y=1) is observed 125 times, a set (x=1, y=1) is observed 1331 times, a set (x=0, y=2) is observed 729 times, a set (x=1, y=2) is observed 343 times, a set (x=0, y=3) is observed 2197, and a set (x=1, y=3) is observed 27 times.

The conditional probability P(y|x) of the true channel is estimated as follows based on this histogram. When the number (hereinafter referred to as the frequency) of observations of each set (x, y) is F(x, y), for example, the conditional probability P(y=0|x=0) of a set (x=0, y=0) being observed is obtained by the following equation (1). The conditional probability P of a set (x=1, y=0) being observed is obtained by the following equation (2).

$$P(y=0|x=0)=F(x=0,y=0)\Sigma y'F(x=0,y')=1/3052 \quad \text{Equation (1)}$$

$$P(y=0|x=1)=F(x=1,y=0)\Sigma y'F(x=1,y')=3375/5076 \quad \text{Equation (2)}$$

With respect to an assumed channel, an LLR table is created such that an LLR value obtained from the following equation (3) when the receive value y is 0 is assigned. The LLR value of the equation (3) is round to one decimal place.

$$LLR(y=0)=\ln\{P(y=0|x=0)/P(y=0|x=1)\}=-7.6 \quad \text{Equation (3)}$$

Similarly, also when the receive value y takes 1, 2 and 3, LLR tables are created such that LLR values obtained from the following equation (4), equation (5), and equation (6) are assigned, respectively. The LLR values of the equation (4), the equation (5), and the equation (6) are round to one decimal place.

$$LLR(y=1)=\ln\{P(y=1|x=0)/P(y=1|x=1)\}=-1.9 \quad \text{Equation (4)}$$

$$LLR(y=2)=\ln\{P(y=2|x=0)/P(y=2|x=1)\}=1.3 \quad \text{Equation (5)}$$

$$LLR(y=3)=\ln\{P(y=3|x=0)/P(y=3|x=1)\}=4.9 \quad \text{Equation (6)}$$

The LLR table created as described above can be sufficiently approximated to the LLR table created from the true channel matrix by collecting a sufficient number of sets (x, y). That is, if a sufficient number of sets (x, y) can be collected, "estimation of a channel required for soft-decision decoding" can be accurately executed, and consequently an ideal "LLR table" can be created for a channel to be decoded. The creation of the true LLR table from the true channel matrix is known as DLE.

Next, "estimation of a channel" will be explained. For example, when the number of channels to be decoded is significantly large, in some cases, LLR tables cannot be prepared beforehand, for all different channels. In such cases, if decoding fortunately succeeds, an estimated transmit value (hereinafter referred to as an estimate value) k and a transmit value x match with the probability of error correction not being executed. Therefore, the above-described LLR table creation is executed by using the estimate value k instead of the transmit value x, and the created LLR table is used for an ECC frame in which decoding has failed in a similar channel. Accordingly, even when the LLR table cannot be prepared beforehand, deterioration of the decoding characteristics can be suppressed.

However, even when decoding fails, if the above-described LLR table creation is executed by using the series {k} of estimate values k, and the created LLR table (hereinafter referred to as the estimated LLR table) is used, in some cases, decoding succeeds. The creation of the estimated LLR table is known as DLE2.

As described above, in the decoding in the memory system, when the assumed channel and the actual channel (the nonvolatile memory) are different from each other, the probability of decoding failure increases. However, in some cases, the estimated channel can be approximated to the correct channel based on the result of failed decoding.

Therefore, in the present embodiment, even when decoding fails, by tasking the procedure of channel estimation from the result of the failed decoding, that is, the procedure of estimated LLR table creation one or more times, the possibility of decoding failure caused by the channel mismatch is reduced.

(System Configuration)

FIG. 1 is a block diagram showing a memory system including an example of the decoding device of the first embodiment. A memory system 10 includes a NAND memory 16 as a nonvolatile memory, and a memory controller 14. The memory system 10 is connectable to a host device (hereinafter, referred to as a host) 12. FIG. 1 illustrates a state of the memory system 10 being connected to the host 12. The host 12 may be, for example, an electronic device such as a personal computer or a portable terminal. The NAND memory 16 is controlled by the memory controller 14. The memory controller 14 receives a command from the host 12, and controls the NAND memory 16 based on the received command.

The NAND memory 16 is a nonvolatile memory which stores data in a nonvolatile manner, and is, for example, a NAND type flash memory. As the nonvolatile memory, storage devices other than a NAND type flash memory, such as a three-dimensional flash memory, a resistive random access memory (ReRAM) and a ferroelectric random access memory (FeRAM) can be used. In addition, the nonvolatile memory is not necessarily a semiconductor memory, and various nonvolatile storage media other than a semiconductor memory may be used.

The memory system 10 may be various memory systems including the NAND memory 16, such as a so-called solid state drive (SSD), and a memory card in which the memory controller 14 and the NAND memory 16 are configured as one package.

The memory controller 14 includes a host interface (I/F) 22, a central processing unit (CPU) 24, a random access memory (RAM) 26, a read only memory (ROM) 28, a memory interface 30, an encoding/decoding circuit 32. The host I/F 22, the CPF 24, the RAM 26, the ROM 28, the memory I/F 30, and the encoding/decoding circuit 32 are interconnected by an internal bus 33. As a control program (firmware) stored in the ROM 28 and loaded into the RAM 16 is executed by the CPU 24, the memory controller 14 executes a part, or all of various operations, a part or all of the function of the host-interface 22, and a part, or all of the function of the memory interface 30. Note that a part or all of the operation of each constituent element of the memory controller 14 may be realized by hardware.

The RAM 26 temporarily stores user data which the memory controller 11 receives from the host 12 until the user data is written into the NAND memory 16. The user data transmitted from the host 12 is transferred to the internal bus 33 and is temporarily stored in the RAM 26. In addition, the RAM 26 temporarily stores user data which is read from the NAND memory 16 until the user data is transmitted to the host 12. As the RAM 26, for example, general-purpose memories such as a static random access memory (SRAM) and a dynamic random access memory (DRAM) can be used. Note that the RAM 26 may not be incorporated in the memory controller 14 but may be provided outside the memory controller 14. The RAM 26 also stores an address translation table required for address management, etc.

The memory controller 14 controls writing of data into the NAND memory 16 according to a write command from the host 12, and controls reading of data from the NAND memory 16 according to a read command from the host 12. The memory controller 14 is, for example, a semiconductor integrated circuit configured as a system-on-a-ship (SoC). The host interface 22 is connected to the host 12 via a bus, and controls the communication between the memory controller 14 and the host 12. The host I/F 22 executes processing conforming to an interface standard with the host 12, and outputs a command received from the host 12, user data to be written and the like to the internal bus 33. In addition, the host I/F 22 transmits user data read from the NAND memory 16 and decoded, a response from the CPU 24 and the like to the host 12. The memory interface 30 is connected to the NAND memory 16, and controls the communication between the memory controller 14 and the NAND memory 16. The memory I/F 30 executes a process of writing to the NAND memory 16 based on an instruction from the CPU 24. In addition, the memory I/F 30 executes a process of reading from the NAND memory 16 based on an instruction from the CPU 24.

The CPU 24 controls the constituent elements of the memory system 10. When receiving a command from the host 12 via the host I/F 22, the CPU 24 controls according to this command. For example, according to a command from the host 12, the CPU 24 instructs the memory I/F 30 to write user data into the NAND memory 16. In addition, according to a command from the host 12, the CPU 24 instructs the memory I/F 30 to read, user data from the NAND memory 16.

When receiving a write command from the host 12, the CPU 24 determines a storage area (memory area) in the NAND memory 16 for user data stored in the RAM 26. That is, the CPU 24 manages the write destination of user data. The correspondence between the logical address of user data received from the host 12 and the physical address indicating a storage area of the NAND memory 16 in which the user data is stored is stored in the RAM 26 or the NAND memory 16 as an address translation table.

When receiving a read command from the host 12, the CPU 24 translates a logical address designated by the read command to a physical address by using the address translation table, and instructs the memory I/F 30 to read from the physical address.

The encoding/decoding circuit 32 executes error correction coding of user data temporarily stored in the RAM 26, and creates an ECC frame (code word) including a plurality of bit data. The code word is written into the NAND memory 16. In addition, the encoding/decoding circuit 32 decodes an ECC frame (receive word) read from the NAND memory 16 and obtains user data. The encoding/decoding circuit 32 includes an encoding module 31 which creates a code word at the time of writing, and a decoding module 36 which decodes a receive word at the time of reading. Encoding and decoding are executed in units of ECC frames. Note that a page, which is the unit of a write process and the unit of a read process, includes a plurality of EEC frames.

Examples of the code used by the encoding module 34 are an algebraic code such as a Boss-Chaudhuri-Hocquenghem (BCH) code or a Reed-Solomon (RS) code, a code based on a sparse graph such as a low-density parity-check (LDPC) code, and the like. Note that the data encoded by the encoding module 34 may also include control data used in the memory controller 14, etc., in addition to user data.

At the time of writing data to the NAND memory 16, the CPU 24 instructs the encoding module 34 to encode data. At this time, the CPU 24 determines a storage place (storage address) for a code word in the NAND memory 16, and also instructs the memory I/F 30 to write the code word into the determined storage place.

Based on an instruction from the CPU 24, the encoding module 34 encodes user data in the RAM 26 and creates a code word. The memory I/F 30 controls for writing the code word into the storage place in the NAND memory 16 as instructed by the CPU 24.

At the time of reading data from the NAND memory 16, the CPU 24 designates an address of the NAND memory 16 and instructs the memory I/F 30 to read data. In addition, the CPU 24 instructs the decoding module 36 to start decoding. According to an instruction from the CPU 24, the memory I/F 30 reads data (receive word) from the designated address of the NAND memory 16, and supplies the read data to the decoding module 36.

The decoding module 36 includes a hard-decision decoding module 38 and a soft-decision decoding module 40. The decoding module 36 decodes a receive word read from the NAND memory 16, and obtains a code word stored in the NAND memory 16. The hard-decision decoding module 38 executes error correction based on a hard-decision algorithm, for example, the Chien's search method, the Peterson's method or the like used for the BCH code, the Reed-Solomon code or the like. The soft-decision decoding module 40 executes error correction based on a soft-decision algorithm, for example, the sum product method, the BCJR method or the like used for LDPC codes or turbo codes. In general, the error correction performance of soft-decision decoding is higher than that of hard-decision decoding, but the process time of soft-decision decoding is long. Therefore, for example, the hard-decision decoding module 38 executes hard-decision decoding first, and if decoding by this hard-decision decoding fails, the soft-decision decoding module 40 executes soft-decision decoding. However, the embodiment is not limited to this configuration, and for example, the hard-decision decoding module 38 may be omitted, and only the soft-decision decoding module 40 may be provided.

The NAND memory 16 includes elements such as a memory cell array 42, an input/output circuit 44, a sequencer (control circuit) 46, a driver 48, a sense amplifier 50, and a row decoder 52.

The memory cell array 42 includes a plurality of memory cell blocks (hereinafter referred to simply as blocks) BLR0, BLK1, . . . (which are also referred to collectively as a block BLK). The block BLK is, for example, the unit of a data erase process. Data of each block BLK is collectively erased. The unit of a data erase process may be smaller than one block BLK (and may be, for example, half the block BLK).

Each block BLK is a set of a plurality of string units SU0, SU1, . . . (which are also referred to collectively as a string unit SU). Each string unit SU is a set of a plurality of NAND strings STR0, STR1, . . . (not shown) (which are also referred to collectively as a string STR). The string STR includes a plurality of memory cell transistors MT.

The input/output circuit 44 is connected to the memory controller 14 via a NAND bus.

The sequencer 46 receives a command and an address signal from the input/output circuit 44, and controls the driver 48, the sense amplifier 50 and the row decoder 52 based on the command and the address signal.

The driver 48 supplies a voltage selected from a plurality of voltages to the row decoder 52. The row decoder 52 receives various voltages from the driver 48, receives an address signal from the input/output circuit 44, selects one block BLK based on the received address signal, and applies the voltage from the driver 48 to the selected block BLK.

The sense amplifier 50 senses the state of the memory cell transistor MT, generates read data based on the sensed state, and transfers writs data to the memory cell transistor MT.

FIG. 2 shows an example of the memory cell array 42. Each block BLK includes a plurality of (for example, four) string units SU0 to SU3. However, one block BLK may include only one string unit SU.

Each of p bit lines BL0 to BLp−1 (p is a natural number) is connected to one string STR of each of the string units SU0 to SU3 in each block BLK.

Each string STR includes one select gate transistor ST, a plurality of (for example, eight) memory cell transistors MT0, MT1, MT2, MT3, MT4, MT5, MT6 and MT7, and one select gate transistor DT (DT0, BT1, DT2 or DT3). The memory cell transistor MT corresponds to the memory cell. The transistors ST, MT and DT are connected in series between a source line CELSRC and one bit line BL in this order. The memory cell transistor MT includes a control gate electrode (word line WL) and a charge storage layer insulated from the surroundings, and stores data in a nonvolatile manner based on the amount of charge in the charge storage layer.

A plurality of strings STR connected respectively to a plurality of different bit lines BL constitute one string unit US. In each string unit SU, the control gate electrodes (gates) of the memory cell transistors MT0 to MT7 are connected to word lines WL0, WL1, WL2, WL3, WL4, WL5, W16 and WL7, respectively. In addition, in each block BLK, word lines WL of the same address in different string units SU are interconnected. A set of memory cell transistors MT sharing a word line WL in one string unit SU is referred to as a cell unit CU.

The transistors DT0 to DT3 belong to the string units SU0 to SU3, respectively. When α=0, 1, 2 and 3, the gates of the transistors DTα of each of the strings STR of the string unit SUα are connected to a select gate line SGDLα. The gates of the transistors ST are connected to a select gate line SGSL.

The memory cell transistor MT will be described with reference to FIG. 3. The memory cell transistor MT may constitute an SLC which can store one-bit data per one memory cell transistor or may constitute a multi-level cell (MLC) which can store N-bit data per one memory cell transistor (N is a natural number greater than or equal to 2). In a case where the memory cell transistor is an SLC, one memory cell transistor group corresponds to one page. In a case where the memory cell transistor is an MLC, one memory cell transistor group corresponds to a plurality of pages. Note that the MLC is not limited to an MLC which can store two-bit data per one memory cell transistor but also include a triple-level cell (TLC) which can store three-bit data per one memory cell transistor, a quad-level cell (QLC) which can store four-bit data per one memory cell transistor, and the like. In the first embodiment, the NAND memory 16 can store two-bit data or more per one memory cell transistor MT.

FIG. 3 shows the threshold voltage distribution of the memory cell transistors MT which are TLCs in which three-bit data is stored per one memory cell transistor MT. The threshold voltage of each memory cell transistor MT has a value corresponding to stored data. In the case of storing three-bit data per memory cell transistor MT, each memory transistor MT has any one of eight threshold voltages. The eight threshold voltages correspond to the states of storing data "111", data "110", data "100", data "000", data "010", data "011", data "001" and data "101", respectively. The memory cell transistor MT in the states of storing data "111", data "110", data "100", data "000", data "010", data "011", data "001" and data "101" are referred to as being in states Er, A, B, C, D, E, F and G, respectively. The threshold voltage of the memory cell transistor MT storing data "111" is the lowest, and the threshold voltage of the memory cell transistor MT storing data "101" is the highest.

Even when a plurality of memory cell transistors MT store the same three-bit data, due to variations in the characteristics of the memory cell transistors MT, etc., the memory cell transistors MT may have different threshold voltages. Therefore, the threshold voltages of a plurality of memory cell transistors MT storing the same three-bit data form one distribution.

In order to determine data stored in a memory cell transistor MT to be read, the state of the memory cell transistor MT is determined. In order to determine the state, read voltages VA, VB, VC, VD, VE, VF and VG are sequentially applied to the memory cell transistor MT.

By determining whether the threshold voltage of the memory cell transistor MT to be read exceeds a certain read voltage or not, the threshold voltage of the memory cell transistor MT can be determined. When the memory cell transistor MT receives a read voltage in the control gate electrode, the memory cell transistor MT having a threshold voltage of greater than the read voltage is in an off-state. On the other hand, when the memory cell transistor MT receives a read voltage in the control gate electrode, the memory cell transistor MT having a threshold voltage of less than the read voltage is in an on-state.

A voltage VAEAD is applied to the word line WL of the memory transistor MT of the cell unit CU other than the cell unit CU to be read, and is higher than the threshold voltage of the memory cell transistor MT in any state.

In the memory cell transistor MT in the state Er, electric charge is discharged from the charge storage layer such as a floating gate and data is erased. In the memory transistor MT in any one of the states A to G, electric charge is stored in the charge storage layer such as a floating gate and data is written. Note that the relationship between three-bit data and the state of the memory cell transistor MT is not limited to the above-described example. For example, the threshold voltage of the memory cell transistor MT storing data "111" may be the highest, and the threshold voltage of the memory cell transistor MT storing data "101" may be the lowest. That is, the memory cell transistor in the state G may store data "111", and the memory cell transistor in the state Er may store data "101".

A set of data bits at the same position (digit) of the memory cell transistors MT of one cell unit CU constitute one page.

Reading using a read voltage Vβ (β is A, B, C, D, E, F or G) is referred to as "reading β". Data on a certain page, for example, a lower page is specified by "reading A" and "reading E". That is, whether the memory cell transistor MT to be read is in the state Er or any one of the states A, B, C, D, E, F and G is determined by the "reading A", Next, whether the memory cell, transistor MT to be read in any one of the states A, B, C, D, E, F and G is in any one of the states A, B, C and D or any one of the states E, F and G is determined by the "reading E". When the memory cell transistor MT to be read is in any one of the states ER, E, F and G, the memory cell transistor MT is determined to store data "1" on the fewer page. When the memory cell transistor MT to be read in any one of the states A, B, C and D, the memory cell transistor MT is determined to store data "0" on the lower page.

The same applies to the reading of a middle page and the reading of an upper page. In the middle page reading, data which each memory ceil transistor MT to be read stores on the middle page is determined by "reading B", "reading D" and "reading F". In the upper page reading, data which each memory cell transistor MT to be read stores on the upper page is determined by "reading C" and "reading G".

FIG. 4 shows an example of the sense amplifier 50. The sense amplifier 50 includes p sense amplifier circuits SAC, a plurality of data latches DL0, DL1, DL2, ... , DLq (which are also referred to collectively as a data latch DL), q operation circuits LC and a data latch XDL. Here, p and q are natural numbers. The data latch DLγ (γ is 0 or a natural number less than or equal to q) includes p data latch circuits DLCγ. The data latch XDL includes p data latch circuits XDLC. The data latch circuits DLC and XDLC temporarily store data.

Each bit line BL is connected to one sense amplifier circuit SAC, (q+1) data latch circuits DLC0, DLC1, DLC2, ... , DLCq, one operation circuit LC and one data latch circuit XDLC.

Each sense amplifier circuit SAC is electrically connected to one memory cell transistor MT to be read via one bit line BL connected to the sense amplifier circuit SAC during the reading of data. Then, each sense amplifier circuit SAC senses a voltage whose magnitude is determined based on the threshold voltage of the memory cell transistor MT to be read on a node in the sense amplifier circuit SAC, and determines in which of two states the memory cell transistor MT electrically connected to the sense amplifier circuit is in based on the result of the sensing. The two states of the memory cell transistor MT are expressed as data "0" or data "1", and each sense amplifier circuit SAC stores whether read data is "0" or "1" in any one of the data latches DLC connected to the sense amplifier circuit SAC. Alternatively, a current whose magnitude is determined based on the threshold voltage of the memory cell transistor MT to be read may be sensed on the node in the sense amplifier circuit SAC, and the state of the memory ceil transistor MT may be determined.

The operation circuit LC can execute a logical operation of the data in the data latch circuits DLC and XDLC connected to the operation circuit LC. The logical operation includes a NOT operation, an OR operation, an AND operation, an XOR operation and an XNOR operation.

(Soft-Bit Data, Hard-Bit Data, LLR Table, and LLR Value)

The soft-decision decoding module 40 of the embodiment executes error correction of read data by using hard-bit data and soft-bit data (described above). The soft-decision decoding module 40 obtains an LLR value from hard-bit data and soft-bit data by using an LLR table.

(Decoding Process)

Figure 6:
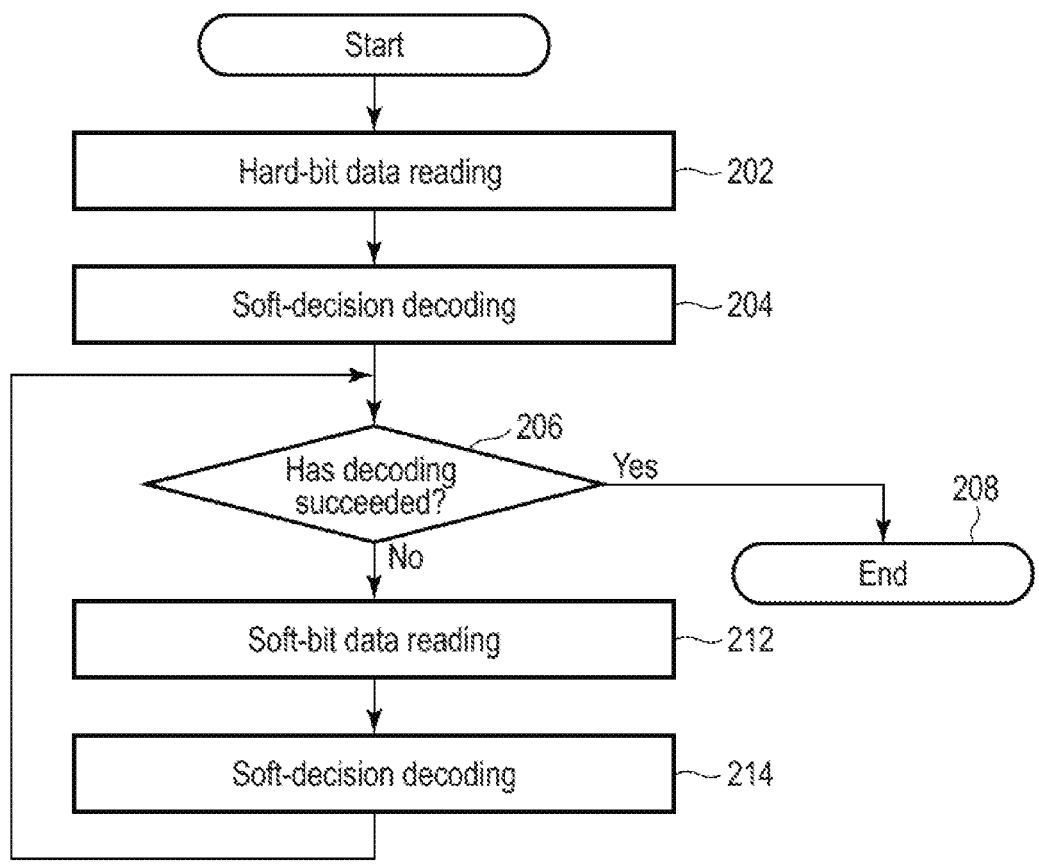
FIG. 6 is a flowchart showing an example of a decoding operation.

FIG. 6 is a flowchart showing an example of the operation of the decoding module 36 according to the first embodiment.

The CPU 24 designates a read address of the NAND memory 16 and instructs the memory I/F 30 to execute hard-bit reading. In step 202, the memory I/F 30 executes hard-bit reading according to the instruction from the CPU 24. In hard-bit reading, each bit constituting data to be read is read as a hard-decision value (hard-bit) indicating either "0" or "1". The read hard-bit is input to the decoding module 36 of the encoding/decoding circuit 32 via the internal bus 33, for example. Since the decoding process is executed for each page and the operation of each page is substantially the same, the decoding process of, for example, a lower page will be explained.

In the hard-bit reading of a lower page, the read voltages VA and VE shown in FIG. 3 are sequentially applied to a selected word line, and the voltage VREAD is applied to an unselected word line. The voltage VREAD is a voltage which turns on a memory cell transistor regardless of stored data, and is a voltage of greater than or equal to the voltage VG. After data is read to a bit line, the data is taken into the sense amplifier 50 in the NAND memory 16, and the output of the sense amplifier 50 is supplied to the hard-decision decoding module 38 via the input/output circuit 44 and the memory I/F 30.

The CPU 24 instructs the hard-decision decoding module 38 to execute hard-decision decoding. In step 204, the hard-decision decoding module 38 executes hard-decision decoding of a hard-decision value for each ECC frame. The hard-decision decoding module 38 executes, for example, decoding such as bounded distance decoding. However, the hard-decision decoding executed by the hard-decision decoding module 38 is not limited to the bounded distance decoding but may be any hard-decision decoding.

After step 204, the hard-decision decoding module 38 determines whether hard-decision decoding has succeeded or not based on the result of a parity check, and notifies the CPU 24 of this determination result (decoding success/decoding failure). In step 206, the CPU 24 determines whether decoding has succeeded or not based on the notification of decoding success/decoding failure from the hard-decision decoding module 38. If decoding has succeeded (YES in step 206), the decoding process ends (step 208).

If decoding has failed (NO in step 206), the CPU 24 designates a read address and instructs the memory I/F 30 to read data from the NAND memory 16 by soft-bit reading having higher error correction performance than hard-bit reading. In step 212, the memory I/F 30 executes soft-bit reading.

Figure 7:
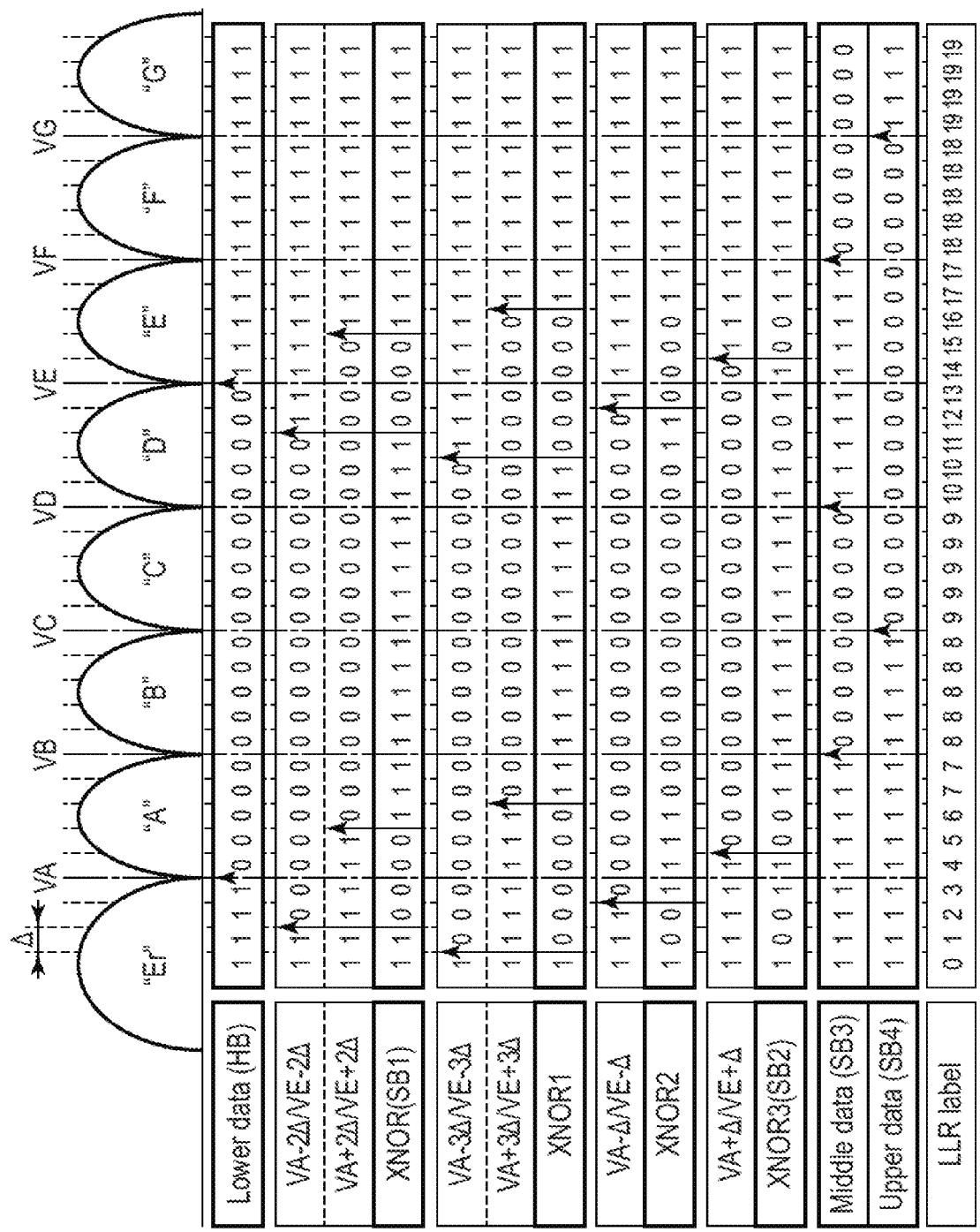
FIG. 7 is an illustration showing an example of soft-bit reading.

An example of the soft-bit reading of step 212 of FIG. 6 will be described with reference to FIG. 7. FIG. 7 shows an example of hard-bit data HB, soft-bit data SB1 to SB4, and an LLR label in a case where a lower page is a page to be read.

As shown in the first row, the hard-bit data HB of the lower page has data "1" in a bit corresponding to a memory ceil transistor MT of a threshold voltage of less than the voltage VA or a threshold voltage of greater than or equal to the voltage VE, and has data "0" in a bit corresponding to a memory cell transistor MT of a threshold voltage of greater than or equal to the voltage VA but less than the voltage VE.

In order to obtain the soft-bit data SB1, the memory controller 14 sets a voltage which is less than the voltage VA by a given voltage M as a read voltage, and reads data a plurality of times while changing the read voltage at substantially regular intervals. In addition, the memory controller 14 sets a voltage which is less than the voltage VE by the given voltage M as a read voltage, and reads data a plurality of times while changing the read voltage at substantially regular intervals. The voltages applied at regular intervals may vary according to the read states (A to G). The voltage applied at regular intervals may vary in a positive direction and a negative direction according to the read states. The difference between the read voltage and each of the voltages VA and VE, that is, the given voltage M is, for example, 2Δ. That is, the memory controller 11 instructs the NAND memory 16 to store the result of reading of the lower page using the voltages VA-2Δ and VE-2Δ in place of the voltages VA and VE in any one of data latches DL. Δ can be any magnitude and is, for example, equal to an integral multiple of the predetermined range of the read voltage which the memory controller 14 can instruct the NAND memory 16 to increase or decrease. Mote that, although the given voltage M is used here, the read voltage may be changed by using a different voltage.

When receiving an instruction, the NAND memory 16 executes reading of data as instructed. As shown in the second row, the result of reading of the lower page by using the voltages VA-2Δ and VE-2Δ has data "1" in a bit corresponding to a memory cell transistor MT of a threshold voltage of less than the voltage VA-2Δ or a threshold voltage of greater than or equal to the voltage VE-2Δ, and data "0" in a bit corresponding to a memory ceil transistor of a threshold voltage of greater than or equal to the voltage VA-2Δ but less than the voltage of VE-2Δ. The data read to a data latch by the lower page reading by using the voltages VA-M and VE-M as the read voltage will be hereinafter referred to as "M lower page data". The "M lower page data" is stored in a data latch (for example, the data latch DL0) of the NAND memory 16.

Similarly, the memory controller 14 instructs the NAND memory 16 to read the lower page by using voltages VA+2Δ and VE+2Δ in place of the voltages VA and VE as the read voltage. The result of the reading is stored in another set of data latches (for example, the data latches XDL) of the NAND memory 16.

Next, the memory controller 14 instructs the NAND memory 16 to execute an XNOR operation of the data in the data latch DL0 and the data in the data latch XDL. When receiving the instruction, the NAND memory 16 executes an XNOR operation of the data in the data latch DL0 and the data in the data latch XDL. For example, the sequencer 46 uses bits at the same position of the data in the data latch DL0 and the data in the data latch XDL, that is, a total of two bits as inputs, executes an NXOR operation of two inputs by using the operation circuit LC, and executes this operation for all bits of the data in the data latch DL0 and the data in the data latch XDL. The result of the operation is stored in the data latch (for example, the data latch XDL).

More specifically, the sequencer 46 executes an XNOR operation of data in a data latch circuit DLC0 and data in a data latch circuit XDLC connected to the data latch circuit DCL0 by using the operation circuit LC connected to these data latch circuits DLC0 and XDLC. The result of the operation is stored in the data latch circuit XDLC connected to the data latch circuits DLC0 and XDLC which store the input data of the logical operation. The data thereby stored in the data latch XDL is the soft-bit data SB1. The soft-bit data SB1 is then transmitted to the memory controller 14 and stored in the RAM 26.

Similarly, the soft-bit data SB2 is obtained by reading data from a selected page to the data latch DL a plurality of times and executing a logical operation a plurality of times. First, the result (XNOR1 data) of the XNOR operation of "−3Δ lower page data" and "+3Δ lower page data" is obtained. Then, the result (XNOR2 data) of the XNOR operation of XNOR1 data and "−Δ lower page data" is obtained. The result (XNOR3 data) of the XNOR operation of the XNOR2 data and "+Δ lower page data" is obtained. The XNOR3 data is the soft-bit data SB2, and is transmitted to the memory controller 14 and stored in the RAM 26.

Furthermore, the memory controller 14 instructs the NAND memory 16 to read the middle page and the upper page of the selected cell unit. CU, and obtains middle page data and upper page data. The middle page data and the upper page data are treated as the soft-bit data SB3 and the soft-bit data SB4, respectively.

A set of bits derived from the result of reading of data from one (the same) selected transistor MT, of hard-bit data and various soft-bit data constitutes one LLR label. The number of bits in the set constituting one LLR label depends on the method of error correction by the soft-decision decoding module 40. The number of bits in the set used is not limited in particular in the embodiment. In the example shown in FIG. 7, a set of five bits derived from the result of reading of data from one (the same) selected memory cell transistor MT, of the hard-bit data HD and the soft-bit data SB1 to SB4 constitutes one LLR label. Each LLR label has a value unique to each combination of the values of five bits. The LLR label is expressed by a decimal number in FIG. 7. FIG. 8 shows an example of the LLR table.

Note that the soft-bit data SB1 to SB4 may be generated not in the NAND memory 16 but in the memory controller 14. In that case, the memory controller 14 receives "M lower page data" about various values of M for calculations of the soft-bit data SB1 to SB4 from the NAND memory 16. Then, the memory controller 14 executes as logical operation of the received "M lower page data", and generates the soft-bit data SB1 to SB4.

The explanation returns to FIG. 6, and when the soft-bit reading is completed, the CPU 24 instructs the soft-decision decoding module 40 to execute soft-decision decoding. The soft-decision decoding module 40 executes soft-decision decoding of read data of each ECC frame based on the result of soft-bit reading (step 214). After step 211, the soft-decision decoding module 40 determines whether decoding has succeeded or not based on the result of a parity check, and notifies the CPU 24 of the determination result. After that, the process returns to step 206.

In step 206, the CPU 24 determines whether decoding has succeeded or not based on the notification from the soft-decision decoding module 40. If decoding has succeeded (YES in step 206), the decoding process ends (step 208).

If decoding has failed (NO in step 206), step 212 is executed again.

Figure 9:
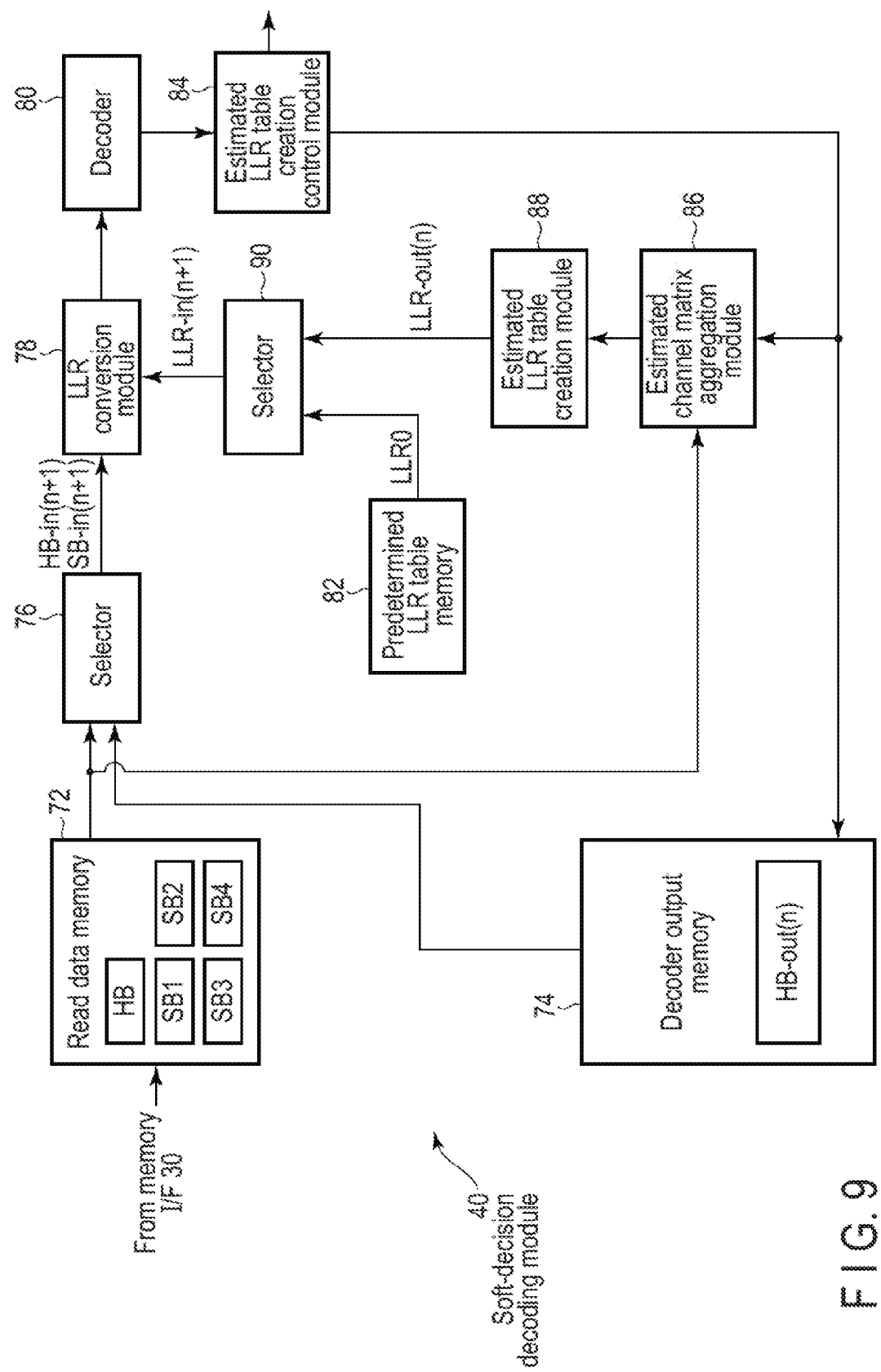
FIG. 9 is a block diagram showing an example of a soft-decision decoding module.

FIG. 9 is a block diagram showing a more detailed configuration example of the soft-decision decoding module 40 according to the present embodiment. The soft-decision decoding module 40 includes a read data memory 72, a decoder output memory 74, a selector 76, an LLR conversion module 78, a decoder 80, a predetermined LLR table memory 82, an estimated LLR table creation control module 84, an estimated channel matrix aggregation module 86, an estimated LLR table creation module 88, and a selector 90.

The read data memory 72 stores the hard-bit data HB and a plurality of, for example, four soft-bit data SB1, SB2, SB3, and SB4 read from the NAND memory 16. The hard-bit data HB and the four soft-bit data SB1, SB2, SB3, and SB4 correspond to the series {y} of receive values y.

The decoder 80 outputs hard-bit data HB-out (n) and a plurality of, for example, four soft-bit data SB1-out (n), SB2-out (n), SB3-out (n) and SB4-out (n) which are the result of decoding. The hard-bit data HB-out (n) and the four soft-bit data SB1-out (n) to SB4-out (n) correspond to the series of estimate values (k). Here, "n" is the number of decoding processes in repetitive decoding (n≥1).

The hard-bit data HB-out (n) and the soft-bit data SB1-out (n) to SB4-out. (n) which are output from the decoder 80 are supplied to the estimated LLR table creation control module 84. The estimated LLR table creation control module 84 determines whether to output the output data of the decoder 80 to the outside or the estimated channel matrix aggregation module 86 and the decoder output memory 74 as the soft-decision decoding result, and outputs the output data of the decoder 80 to the output destination based on the determination result. The decoder output memory 74 stores the hard-bit data HB-out (n).

The hard-bit data HB and the soft-bit data SB1 to SB4 which are output from the read data memory 72 are supplied to the first input terminal of the selector 76, and the hard-bit data HB-out (n) which is output from the decoder output memory 14 is supplied to the second input, terminal of the selector 76. The selector 76 selects the first input terminal or the second input, terminal according to a selection control signal supplied from the CPU 24, and supplies the signal of the selected input terminal to the LLR conversion module 78 as HB-in (n+1) and SB-in (n+1). The selection control signal indicates the number "n" of repetitions of soft-decision decoding.

The hard-bit output data HB-out (n) of the decoder 80 and the soft-bit output data SB1-out (n) to SB4-out (n) of the decoder 80 which are output from the estimated LLR table creation control module 84 are supplied to the estimated channel matrix aggregation module 86. The hard-bit data HB and the soft-bit data SB1 to SB4 which are output from the read data memory 72 are also supplied to the estimated channel matrix aggregation module 86.

The estimated channel matrix aggregation module 86 aggregates the sets (k, y) including the hard-bit data HB and the soft-bit data SB1 to SB4 (receive values y) which are output from the read data memory 72 and the hard-bit output data HB-out (n) of the decoder 80 and the soft-bit output data SB1-out (n) to SB4-out (n) of the decoder 80 (estimate values k), and creates an estimated channel matrix which is a list of probabilities P(y|k) based on the aggregation result. The estimated channel matrix aggregation module 86 out- puts the created estimated channel matrix to the estimated LLR table creation module 88.

The estimated LLR table creation module 88 calculates an estimated LLR table LLR-out (n) from the estimated channel matrix. Then, the estimated LLR table creation module 88 supplies the estimated LLR table LLR-out (n) obtained by the calculation to the first input terminal of the selector 90.

The predetermined LLR table memory 82 stores a plurality of predetermined LLR tables corresponding to a plurality of causes of a threshold voltage variation which is a typical cause of the decoding failure of the nonvolatile memory. The predetermined LLR table memory 82 supplies a predetermined LLR table LLR0 selected by the CPU 24 to the second input terminal of the selector 90. The predetermined LLR table memory 82 may store a Gauss table as a predetermined LLR table instead of storing a plurality of predetermined LLR tables or store a common predetermined LLR table corresponding to a "program disturb phenomenon", a "read disturb phenomenon" and a "data retention phenomenon" which are causes of a threshold voltage variation which is a typical cause of the decoding failure of the nonvolatile memory.

The selector 90 selects the first input terminal or the second input terminal according to the selection control signal supplied from the CPU 24, and supplies the signal of the selected input terminal to the LLR conversion module 78 as LLR-in (n+1). The selection control signal of the selector 90 is the same as the selection control signal of the selector 76, and indicates the number "n" of repetitions of soft-decision decoding.

The LLR conversion module 78 converts the hard-bit data HB and the soft-bit data SB1 to SB4 which are input via the selector 76 to an LLR value by using the predetermined LLR table or the estimated LLR table which is input via the selector 90.

The decoder 80 inputs a series of LLR values of each ECC frame, and executes error correction processing (decoding). As the result of processing, hard-bit data HS-out (n), and a plurality of, for example, four soft-bit data SB1-out (n) to SB4-out (n) are output.

The operation of the selector 76 and the operation of the selector 90 are shown in FIG. 10. The hard-bit data selected by the selector 76 and supplied to the LLR conversion module 78 will be referred to as HB-in (n), the soft-bit data will be referred to as SB1-in (n), SB2-in (n), SB3-in (n), and SB4-in (n). The LLR table selected by the selector 90 and supplied to the LLR conversion module 78 will be referred to as LLR-in (n). Since the soft-bit data are not stored in the decoder output memory 74, the selector 76 always selects the output of the read data memory 72 for the soft-bit data.

In the first decoding (n−1), the selector 76 selects the output HB of the read data memory 72 as the hard-bit data HB-in (n), and selects SB1 to SB4 as the soft-bit data SB1-in (n) to SB4-in (n). The selector 90 selects the predetermined LLR table LLR0 which is the output of the predetermined LLR table memory 82 as LLR-in (n).

From, the second decoding (n≥2), the selector 76 selects the output HB-out (n−1) of the decoder output memory 74 as the hard-bit data HB-in (n), and selects the outputs SB1 to SB4 of the read data memory 72 as the soft-bit data SB1-in (n) to SB4-in (n). The selector 90 selects the estimated LLR table LLR-out (n−1) which is the output of the estimated LLR table creation module 88 as LLR-in (n).

As described above, from the second decoding, the LLR table LLR-in (n) supplied to the LLR conversion module 78 is the estimated LLR table LLR-out (n−1), and the hard-bit data HB-in (n) supplied to the LLR conversion module 78 is the decoding result HB-out (n−1) of the decoder 80. Therefore, even if decoding has failed, by executing the estimated LLR table creation by using the decoding result obtained by the failed decoding, an LLR table according to the threshold voltage distribution of the nonvolatile memory can be created, and the possibility of decoding failure can be reduced. In addition, since hard-bit data in which an error has been corrected in the previous decoding is the hard-bit data to be decoded from the second decoding, the number of initial error bits at the time of decoding can be reduced, and the possibility of decoding failure can be further reduced.

The LLR conversion module 58 obtains an LLR value for a combination (LLR label) of hard-bit data and soft-bit data which are supplied via the selector 76 by using an LLR table such as that of FIG. 8 which is supplied via the selector 90, and supplies the obtained LLR value to the decoder 80.

Figure 11:
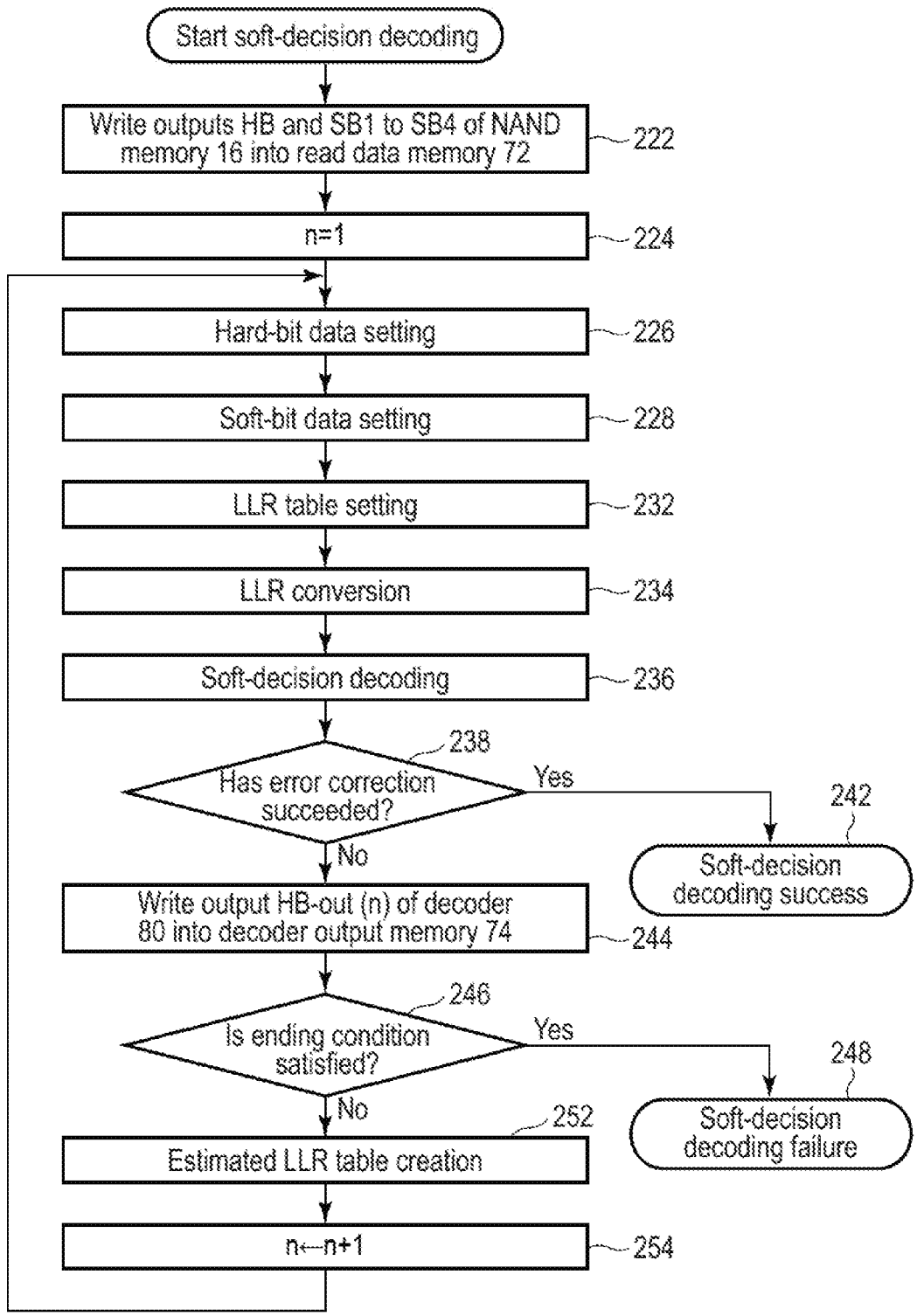
FIG. 11 is a flowchart showing an example of the operation of the soft-decision decoding module.

FIG. 11 is a flowchart showing an example of the soft-decision decoding of step 214 of FIG. 6. In step 222, the CPU 24 writes the HB and SB1 to SB4 output from the NAND memory 16 into the read data memory 72.

In strap 224, the CPU 24 sets the number "n" indicating the number of repetitions of soft-decision decoding to 1, and supplies the selection control signal including the number "n" to the selectors 76 and 90.

In step 226, the CPU 24 executes hard-bit data setting by controlling the selector 76.

Figure 12:
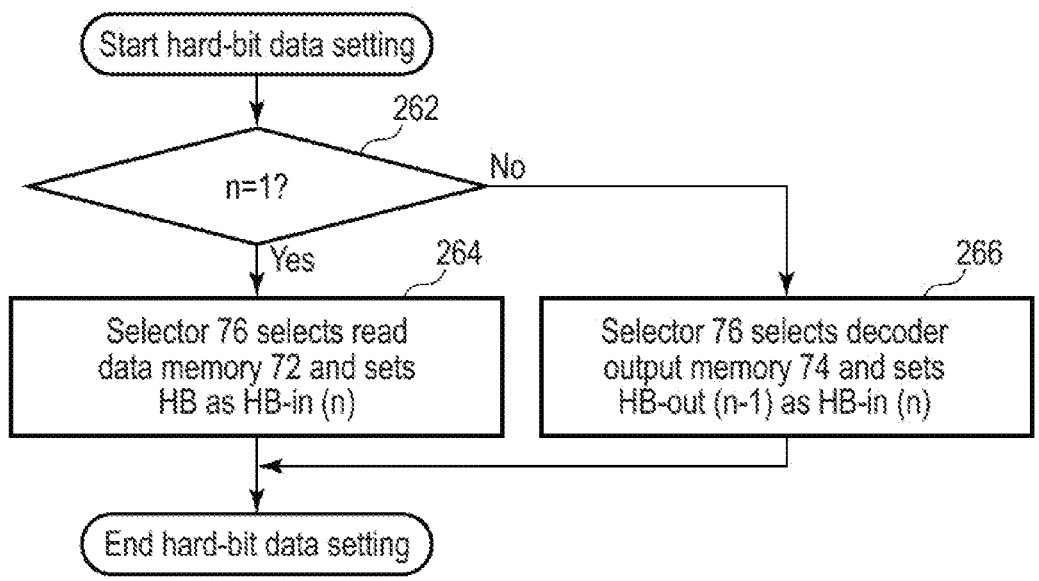
FIG. 12 is a flowchart showing an example of hard-bit data setting.

FIG. 12 is flowchart showing an example of the hard-bit data setting of step 226. In step 262, the selector 76 determines whether the number "n" included in the selection control signal is 1 or not. If n=1 (the determination result of step 262 is YES), the selector 76 selects the read data memory 72 and sets the output HB of the read data memory 72 as the input, HB-in (n) to the LLR conversion module 78 in step 264. If n≠1 (n≥2) (the determination result of step 262 is NO), the selector 76 selects the decoder output memory 74 and sets the output HB-out (n−1) of the decoder output memory 74 as the input HB-in (n) to the LLR conversion module 78 in step 266.

The explanation returns to FIG. 11, and in step 228, the CPU 24 executes soft-bit data setting by controlling the selector 76.

Figure 13:
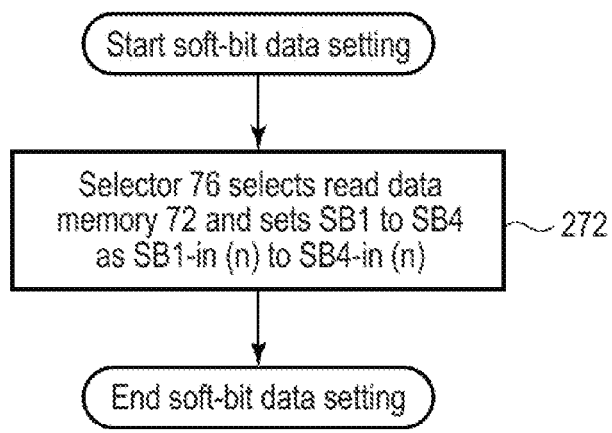
FIG. 13 is a flowchart showing an example of soft-bit data setting.

FIG. 13 is a flowchart showing an example of the soft-bit data setting of step 228. In step 272, the selector 76 selects the read data memory 72 regardless of the value of the number "n" included in the selection control signal, and sets the outputs SB1 to SB4 of the read data memory 72 as the inputs SB-in (n) to SB4-in (n) to the LLR conversion module 78.

Figure 14:
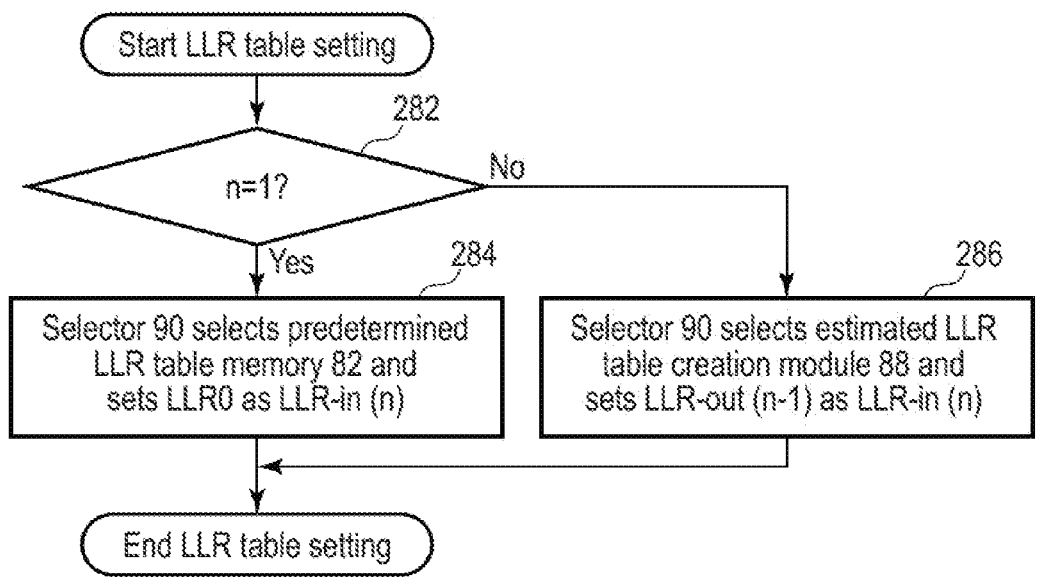
FIG. 14 is a flowchart showing an example of LLR table setting.

The explanation returns to FIG. 11, and in step 232, the CPU 24 executes LLR table setting by controlling the selector 90, FIG. 14 is a flowchart showing an example of the LLR table setting of step 232. In step 282, the selector 90 determines whether the number "n" included in the selection control signal is 1 or not. If n=1 (the determination result of step 282 is YES), the selector 90 selects the predetermined LLR table memory 82 and sets the output LLR0 of the predetermined LLR table memory 82 as the input LLR-in (n) to the LLR conversion module 78 in step 281. If n≠1 (n≥2) (the determination result of step 282 is NO), the selector 90 selects the estimated LLR table creation module 88 and sets the output LLR-out (n−1) of the estimated LLR table creation module 88 as the input LLR-in (n) to the LLR conversion module 78 in step 286.

The explanation returns to FIG. 11, and in step 234, the CPU 24 executes LLR conversion by using the LLR conversion module 78.

Figure 15:
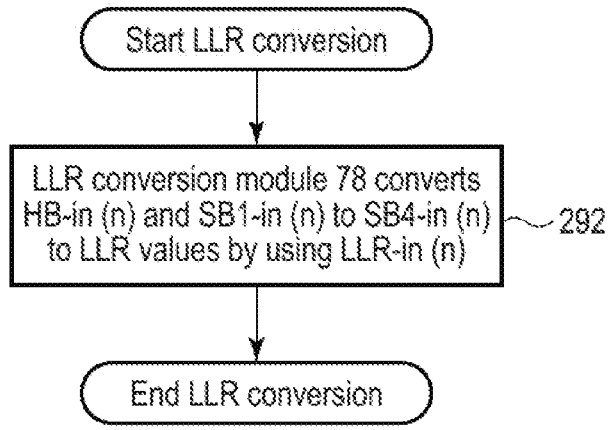
FIG. 15 is a flowchart showing an example of LLR conversion.

FIG. 15 is a flowchart showing an example of the LLR conversion of step 234. In step 292, the LLR conversion module 78 converts the hard-bit data HB-in (n) and the soft-bit data SB1-in (n) to SB4-in (n) supplied from the selector 76 to an LLR value by using the LLR table LLR-in (n) supplied from the selector 90.

The explanation returns to FIG. 11, and in step 236, the CPU 24 executes soft-decision decoding such as LDPC decoding by using the decoder 80. In soft-decision decoding by LDPC decoding, error correction processing is executed by a probability-based repetitive operation based on an initial LLR value obtained from the LLR table.

In step 238, the CPU 24 determines whether error correction has succeeded or not based on the result, of a parity check. If error correction has succeeded, the CPU 24 ends the soft-decision decoding as soft-decision decoding success (correction OK) in step 242. If error correction has failed, the CPU 24 writes HB-out (n) which is the decoding result of the decoder 80 into the decoder output memory 74 in step 244.

In step 246, the CPU 24 determines whether an ending condition is satisfied or not. Whether an ending condition is satisfied or not may be determined by, for example, whether the number "n" of repetitions of soft-decision decoding reaches its upper limit, for example, four or not. If the ending condition is satisfied, the CPU 24 ends soft-decision decoding as soft-decision decoding failure (correction NG) in step 248.

If the end condition is not satisfied, the CPU 24 instructs the estimated LLR table creation control module 84, the estimated channel matrix aggregation module 86 and the estimated LLR table creation module 88 to create an estimated LLR table in step 252. The estimated LLR table created by the estimated LLR table creation module 88 is stored in a memory within the estimated LLR table creation module 88 which is not shown in the drawing.

In step 254, the CPU 24 increments the number "n" of repetitions of soft-decision decoding by one, and supplies the select control signal including the number "n" to the selectors 76 and 90. After that, the CPU 24 repeats the process from step 226.

Figure 16:
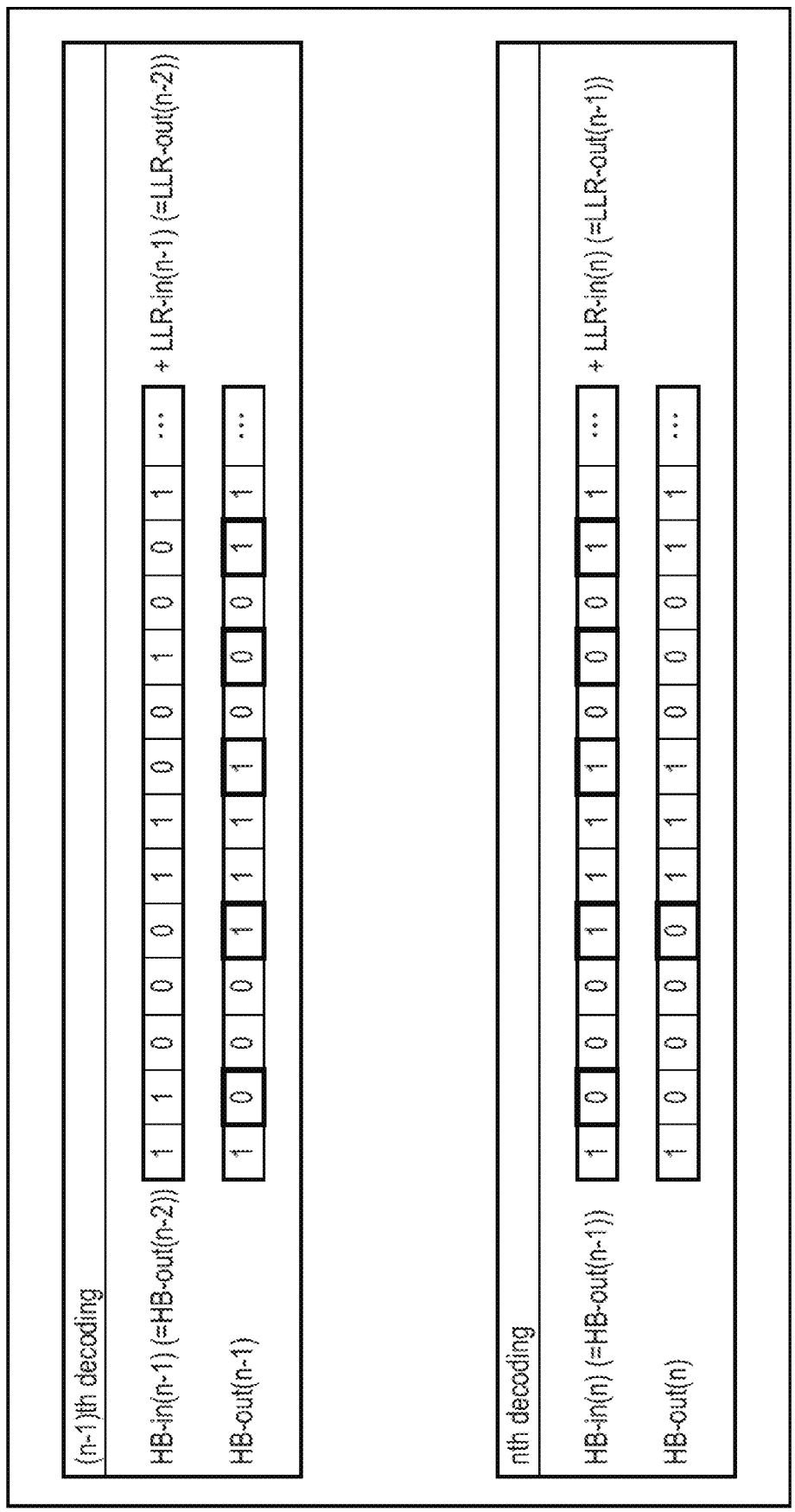
FIG. 16 is an illustration for explaining an example of the operation of the soft-decision decoding module.

FIG. 16 snows an example of the operation of the soft-decision decoding module 40 on hard-bit data.

In the (n−1)th soft-decision decoding (here, n≥2), the LLR conversion module 78 convers the hard-bit data HB-in (n−1) (=HB-out (n−2)) which is the decoding result to an LLR value by using the estimated LLR table LLR-in (n−1) (=LLR-out (n−2)). The LLR value is subjected to soft-decision decoding by the decoder 80, and the soft-decision decoding result HB-out (n−1) is obtained.

In the nth soft-decision decoding, the LLR conversion module 78 converts the hard-bit data HB-in (n) (=HB-out (n−1)) which is the decoding result by using the estimated LLR table LLR-in (n) (=LLR-out (n−1)). The LLR value is subjected to soft-decision decoding by the decoder 80, and the soft-decision decoding result HB-out (n) is obtained.

In FIG. 16, a bit in which an error is corrected as a result of error correction in each decoding and a value is inverted in each decoding (HB-out (n) is inverted from HB-in (n)) is indicated by a thick frame. In the (n−1)th soft-decision decoding, five bits are inverted. In the nth soft-decision decoding, only one bit is inverted. Since hard-bit data in which an error has been corrected in the previous decoding is the hard-bit data to be decoded in each decoding, the number of bits corrected in each decoding is reduced, and the possibility of decoding success can be increased.

According to the first embodiment, if soft-decision decoding fails, decoding is executed again by using an estimated LLR table created by DLE2, and if the decoding fails, by executing DLE2 again, an LLR table which is more accurate than the LLR table created by the first DEL2 can be created, and error correction performance can be improved, in addition, according to the first embodiment, since hard-bit data in which the number of initial error bits has been reduced by the failed decoding is subjected to the next decoding, bits which have been corrected once are maintained. Therefore, the number of initial error bits included at the start of the next decoding can be reduced, and the possibility of decoding failure can be reduced.

Second Embodiment

In the first embodiment, from the second decoding, ail bits of hard-bit data output from the decoder 80 are set as hard-bit data to be decoded. In the second embodiment, a certain inverted bit in hard-bit data output from the decoder 80 is not used as hard-bit data to be decoded. An inverted bit of the decoding result is a bit in which an error has been corrected, and since error correction has been executed but decoding has not succeeded in the end, whether this error correction was proper or not is not known. Therefore, in the second embodiment, an inverted bit having low reliability of inverted bits of hard-bit data output from the decoder 80 is used not as hard-bit data to be decoded. For that bit, the hard-bit data output from the decoder 80 at the previous decoding is used as hard-bit data to be decoded in the current, decoding. In order to do so, it is only necessary to invert the inverted bit having low reliability of the inverted bits of the hard-bit data output from the decoder 80.

Figure 17:
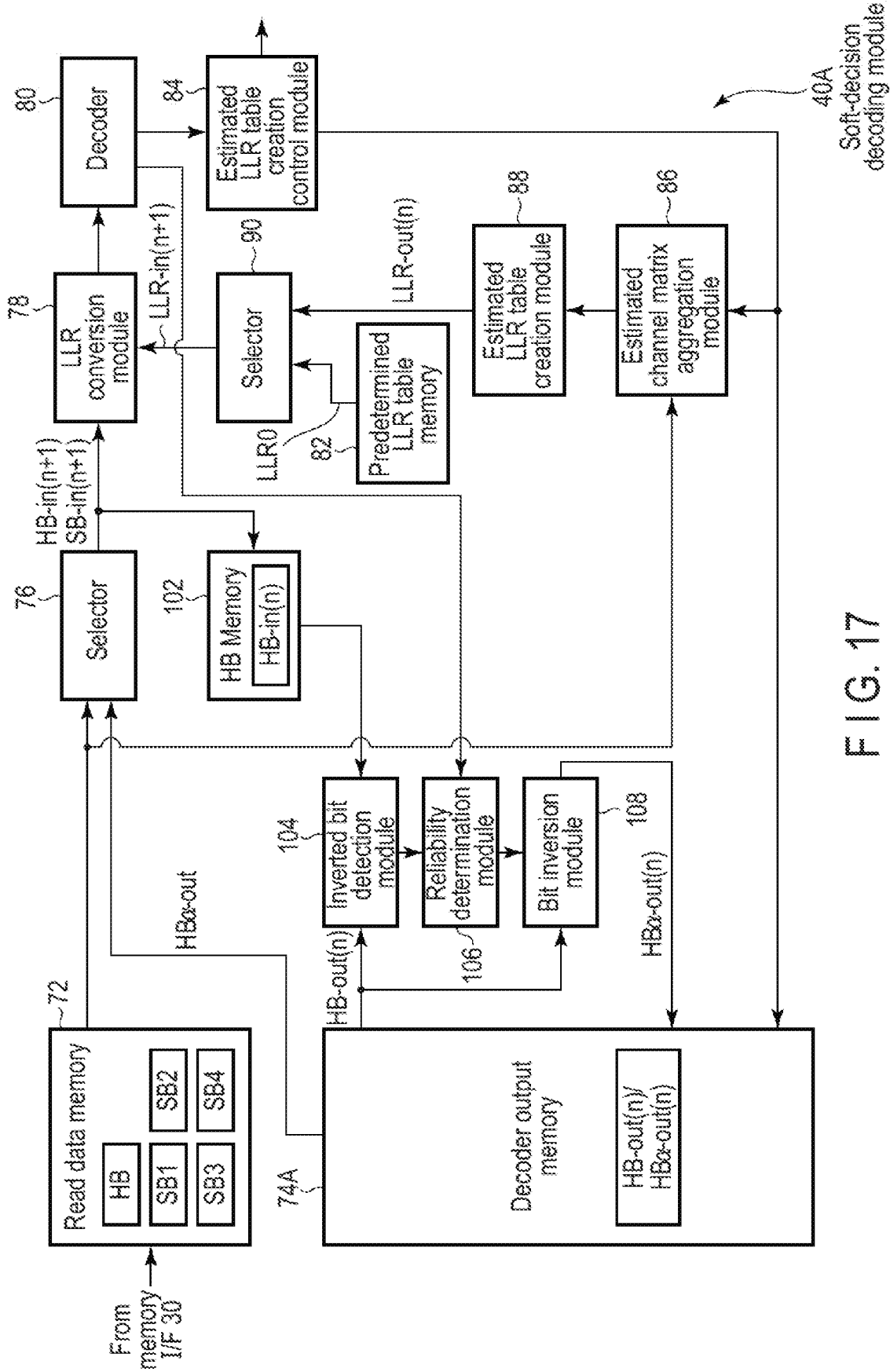
FIG. 17 is a block diagram showing an example of a soft-decision decoding module according to the second embodiment.

FIG. 17 is a block diagram showing an example of a soft-decision decoding module 40A according to the second embodiment. Many parts of the soft-decision decoding module 40A are the same as the configuration of the soft-decision decoding module 40 according to the first embodiment shown in FIG. 9. The soft-decision decoding module 40A is different from the soft-decision decoding module 40 in that an HE memory 102, an inverted bit detection module 104, a reliability determination module 106, and a bit inversion module 108 are provided and a decoder output memory 74A is provided in place of the decoder output, memory 74.

The decoder output memory 74A stores HB-out (n) and HBα-out (n).

The output HB-in (n) of the selector 76 is stored in the HB memory 102. The output HB-in (n) of the HB memory 102 and the output HB-out (n) of the decoder output memory 74A are input to the inverted bit detection module 104. The output HB-out (n) of the decoder output memory 74A is input to the bit inversion module 108. The inverted bit detection module 104 detects inverted bits in HB-in (n) and HB-out (n). The reliability determination module 106 determines the reliability of the inverted bits detected by the inverted bit detection module 104. The reliability is determined by a method using a syndrome, a method using a posterior value of an LLR operation, or the like. The decoder 80 may supply the operation result of the syndrome to the reliability determination module 106. The operation result of the syndrome indicates whether error correction has succeeded (OK) or failed (NG). The decoder 80 may calculate the posterior value of the LLR value at the time of decoding and supply the posterior value to the reliability determination module 106.

When the reliability determination module 106 detects an inverted bit having low reliability, the reliability determination module 106 controls the bit inversion module 108 to invert the bit. The other bits of HB-out (n) are maintained as they are and allowed to pass through the bit inversion module 108. From the second decoding, in place of HB-out (n−1), the output HBα-out (n−1) of the bit inversion module 108 is input to the LLR conversion module 73 as HB-in (n).

FIG. 18 shows an example of the determination of the reliability of the inverted bit by the reliability determination module 106. Here, the encoding module 34 is assumed to employ two-dimensional (n rows and m columns) BCH product coding, FIG. 18 shows hard-bit data MB (xn, ym) of one ECC frame in two dimensions. One cell of FIG. 18 represents k-bit data. Data has n rows and m columns, and a plurality of inspection bits are added to each row and a plurality of inspection bits are added to each column. By executing an operation of a syndrome including inspection bits, BCH coding in a row direction can be corrected up to i bits, and BCH coding in a column direction can be corrected up to j bits. The decoder 80 supplies the operation result of the syndrome to the reliability determination module 106.

The reliability determination module 106 recognizes which bit of hard-bit data HB corresponds to which cell, and determines the reliability of an inverted bit based on the operation result of the syndrome. For example, the reliability determination module 106 determines that a bit corresponding to a cell in which the syndrome operation result in the row direction or the column direction indicates correction NG has low reliability, and determines that a bit corresponding to a cell in which the syndrome operation result in the row direction or the column direction indicates correction OK has high reliability.

FIG. 19 shows an example of the operation of the soft-decision decoding module 40A on hard-bit data.

In the (n−1)th soft-decision decoding, the LLR conversion module 78 converts hard-bit data HB-in (n−1) (=HBα-out (n−2)) to an LLR value by using an estimated LLR table LLR-in (n−1) (=LLR-out (n−2)). The LLR value is subjected to soft-decision decoding by the decoder 80, and a soft-decision decoding result HB-out (n−1) is obtained. Inverted bits of the soft-decision decoding result HB-out (n−1) are in a state of correction OK or a state of correction NG based on the syndrome operation result. Inverted bits in the correction OK state have high reliability, and inverted bits in the correction NG state have low reliability.

In the nth soft-decision decoding, the bit inversion module 108 outputs HBα-out (n−1) in which inverted bits having low reliability in HB-out (n−1) output from the decoder output memory 74 are inverted and the other bits are maintained as they are to the selector 76. The LLR conversion module 78 converts hard-bit data HB-in (n) HBα-out (n−1)) to an LLR value by using the estimated LLR table LLR-in (n) (=LLR-out (n−1)). The LLR value is subjected to soft-decision decoding by the decoder 80, and a soft-decision decoding result HB-out (n) is obtained.

The reliability of the inverted bit can also be determined based on the posterior value of the LLR. FIG. 20 shows a mapping table of posterior values. When the posterior value takes values from −31 to +31, if the absolute value of the posterior value is greater than or equal to a certain value (for example, 24), it is possible to determine that the reliability of the bit is high. The absolute value of the posterior value being greater than or equal to 24 is equivalent to the bits [4:3] of the posterior value being "11". Therefore, the reliability determination module 106 determines that bits in which the bits [4:3] of the posterior value are other than "11" are bits having low reliability. The reliability determination module 106 determines that bits in which the bits [4:3] of the posterior value are other than "11" of hard-bit data are bits having low reliability bit, and controls the bit inversion module 108 to invert the bits having low reliability of inverted bits in HB-out (n) and allow the other bits to pass through.

FIG. 21 shows an example of the operation of the soft-decision decoding module 40A on hard-bit data by using the posterior value of the LLR.

In the (n−1)th soft-decision decoding, the LLR conversion module 78 converts hard-bit data HB-in (n−1) (=HBα-out (n−2)) to an LLR value by using an estimated LLR table LLR-in (n−1) (=LLR-out (n−2)). The LLR value is subjected to soft-decision decoding by the decoder 80, and a soft-decision decoding result HB-out (n−1) and a posterior value (n−1) are obtained. Each bit of the soft-decision decoding result HB-out (n−1) is classified as a bit having high reliability and a bit having low reliability based on the posterior value (n−1). Inverted bits having the absolute value of the posterior value (n−1) of greater than or equal to 24 have high reliability, and the other inverted bits have low reliability.

The bit inversion module 108 writes HBα-out (n−1) into the decoder output memory. In HBα-out (n−1), inverted bits having low reliability of HB-out (n−1) output from the decoder output memory 74 are inverted and the other bits are maintained as they are.

In the nth soft-decision decoding, the LLR conversion module 78 converts the hard-bit data HB-in (n) (=HBα-out (n−1)) by using an estimated LLR table LLR-in (n) (=LLR-out (n−1)). The LLR value is subjected to soft-decision decoding by the decoder 80, and a soft-decision decoding result HR-out (n) and a posterior value (n) are obtained.

Figure 22:
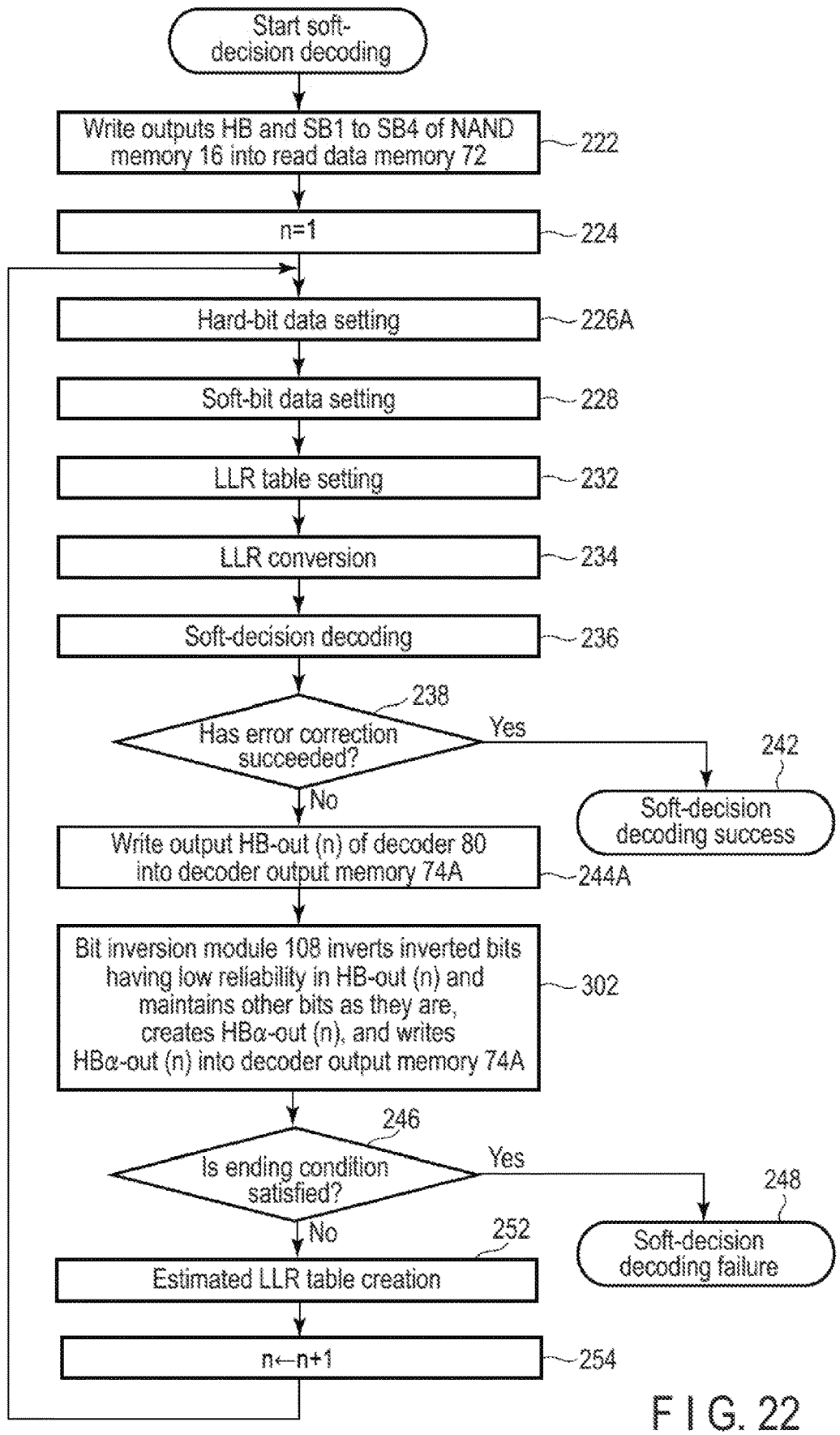
FIG. 22 is a flowchart showing an example of the operation of the soft-decision decoding module.

FIG. 22 is a flowchart showing an example of the soft-decision decoding of the second embodiment. FIG. 22 is substantially the same but is different from the flowchart of the first embodiment shown in FIG. 11 in the following point.

The second embodiment is different from the first embodiment in hard-bit data setting of step 226A. FIG. 23 is a flowchart showing an example of the hard-bit data setting of step 226A.

In step 312, the CPU 24 determines whether n=1 or not. If n=1 (the determination result of step 312 is YES), the CPU 24 causes the selector 76 to select the read data memory 72 in step 314. Accordingly, the output HB of the read data memory 72 is set as an input HB-in (n) to the LLR conversion module 78. If n≠1 (n≥2) (the determination result of step 312 is NO), the CPU 24 causes the selector 76 to select the decoder output memory 74A in step 316. Accordingly, an output HBα-out (n−1) of the bit inversion module 108 is set as an input HB-in (n) to the LLR conversion module 78.

In step 244A with which step 244 of FIG. 11 is replaced, the CPU 24 writes HB-out (n) which is the decoding result of the decoder 80 into the decoder output memory 74A. In following step 302, the bit inversion module 108 inverts inverted bits having low reliability of the hard-bit data HB-out (n), allows the other bits to pass through, creates HBα-out (n), and writes HBα-out (n) into the decoder output memory 71A. Note that the decoder output memory 74A may store HBα-out (n) in addition to HB-out (n) or may store HBα-out (n) in place of HB-out (n).

Third Embodiment

In the first and second embodiments, in principle, not the read data of the NAND memory 16 but the previous decoding result HB-out (n−1) is used as hard-bit data HB-in (n) to be decoded. In the third embodiment, in principle, not the read data of the NAND memory 16 but the previous decoding result. SB-out (n−1) is used as soft-bit data SB-in (n) to be decoded. However, with regard to a bit in the decoding result SB-out. (n−1), an inverted, bit located in a hard error area and having a value inverted by error correction is changed such that the position of the bit in a threshold distribution is moved to an area other than the hard error area. As an example of the soft-bit data SB change is a method using a lookup table (LUT).

FIG. 24 shows the concept of rewriting soft-bit data SB-out (n) by using an LUT. The rewriting is executed for all bits of an x-KB frame.

The input of the LUT is four-bit data, and the output of the LUT is two-bit data. The input bit [3] of the LUT is HB-in (n), and the input bit [2] of the LUT is HB-out (n), and input bits [1:0] of the LUT are SB-out (n) [3:2] (higher order two bits). With regard to four soft-bit data, SB1 is the highest order bit, and SB4 is the lowest order bit. Therefore, the input bit [1] of the LUT is SB1-out (n), and the input bit [0] of the LUT is SB2-out (n). The output bits [1:0] of the LUT are SBα-out (n) [3:2]. The output bit [1] of the LUT is SB1α-out (n), and the output bit [0] of the LUT is SB2α-out (n). The input bits [3:2] of the LUT detect whether a bit is inverted or not. The input bits [1:0] of the LUT detect whether read data is in a hard error area or not.

Figures 25, 26:
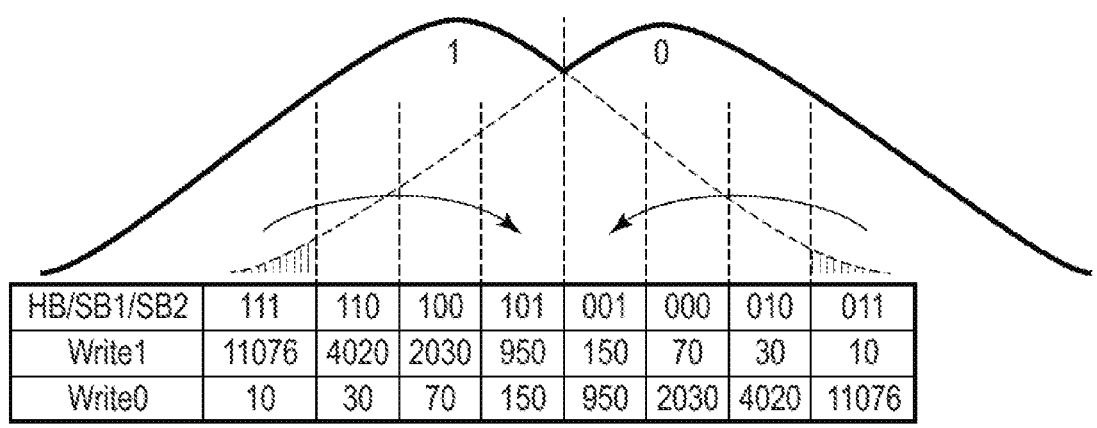
FIG. 25 is an illustration showing an example of the relationship between read data and a threshold voltage.
FIG. 26 is an illustration showing an example of a lookup table for soft-bit data change.

FIG. 25 shows an example of the relationship between read data and a threshold voltage distribution. For the sake of convenience of explanation, soft-bit data SB is assumed to be two-bit data (SB1 and SB2). If soft-bit data SB is four-bit data, the threshold voltage is further divided. The hard-bit error areas are areas at the tails of the threshold voltage distribution. The hard-bit error areas are detected when soft-bit data SB1 and SB2 are "11".

FIG. 26 shows an example of the relationship between the input of the LUT and the output of the LUT. If the input bits [3:2] are "10" or "01" and the input bits [1:0] are "11", the output bits are "01". Therefore, the bits [3:2] of the soft-bit data SB-out (n), that is, the soft-bit data SB1-out (n) and the SB2-out (n) are changed from "11" to "01". By this soft-bit data change, as shown in FIG. 25, the position of the bit located in the hard error area in the threshold distribution moves to an area at the center of the threshold voltage distribution. The area at the center of the threshold voltage distribution is an area which is more likely to be subjected to error correction. Therefore, the error correction performance can be improved, and the possibility of decoding success can be increased. Note that, as in the first and second embodiments, hard-bit data being inverted means that the position of its bit in the threshold voltage distribution is moved such that data can be switched between "1" and "0".

FIG. 27 is a block diagram showing an example of a soft-decision decoding module 40B according to the third embodiment. Many parts of the soft-decision decoding module 40B are the same as the configuration of the soft-decision decoding module 40A according to the second embodiment shown in FIG. 17. The soft-decision decoding module 40B is different from the soft-decision decoding module 40A in that an SB changing module 122 is provided in place of the inverted bit detection module 104, the reliability determination module 106 and the bit inversion module 108, and a decoder output memory 74B is provided in place of the decoder output memory 74A.

The decoder output memory 74B stores SB1-out (n), SB1α-out (n), SB2-out (n), SB2α-out (n), SB3-out (n), SB3α-out (n), SB4-out (n) and SB4α-out (n) in addition to HB-out (n). Note that the decoder output, memory 74B may store SB1α-out (n), SB2α-out (n), SB3α-out (n) and SB4α-out (n) in addition to SB1-out (n), SB2-out (n), SB3-out (n) and SB4-out (n), or may store SB1α-out (n), SB2α-out (n), SB3α-out (n) and SB4α-out (n) in place of SB1-out (n), SB2-out (n), SB3-out (n) and SB4-out (n).

The SB changing module 122 includes an LUT such as that of FIG. 24 or FIG. 26 (in this case, its input is six-bit data and its output is four-bit data), and inputs HB-in (n), HB-out (n), SB1-out (n), SB2-out (n), SB3-out (n) and SB4-out (n) and outputs SB1α-out (n), SB2α-out (n), SB3α-out (n) and SB4α-out (n). SB1α-out (n), SB2α-out (n), SB3α-out (n), and SB4α-out (n) are written into the decoder output memory 74A.

Figure 28:
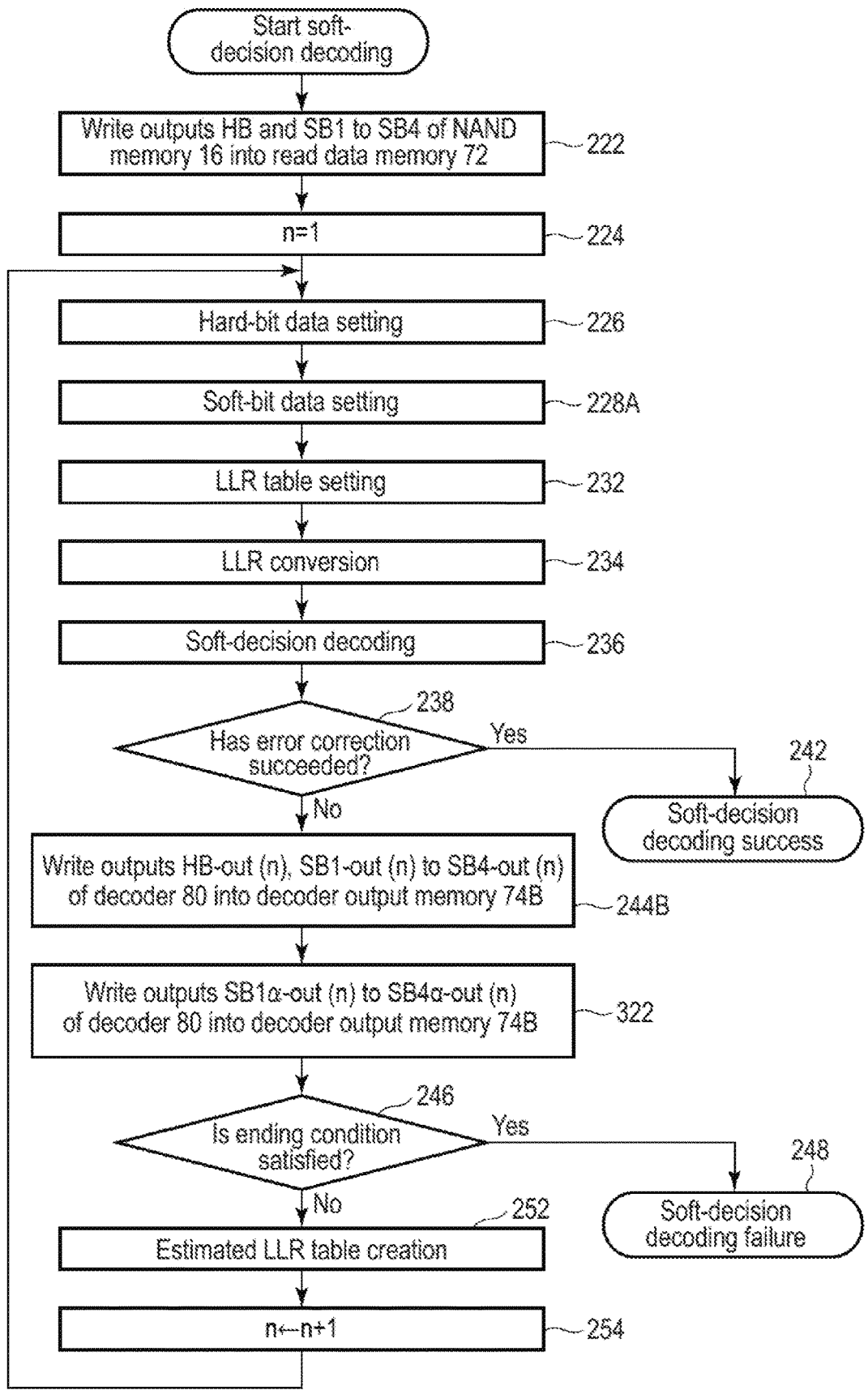
FIG. 28 is a flowchart showing an example of the operation of the soft-decision decoding module.

FIG. 28 is a flowchart showing an example of soft-decision decoding of the third embodiment. FIG. 28 is substantially the same but is different from the flowchart of the first embodiment shown in FIG. 11 in the following point.

Figure 29:
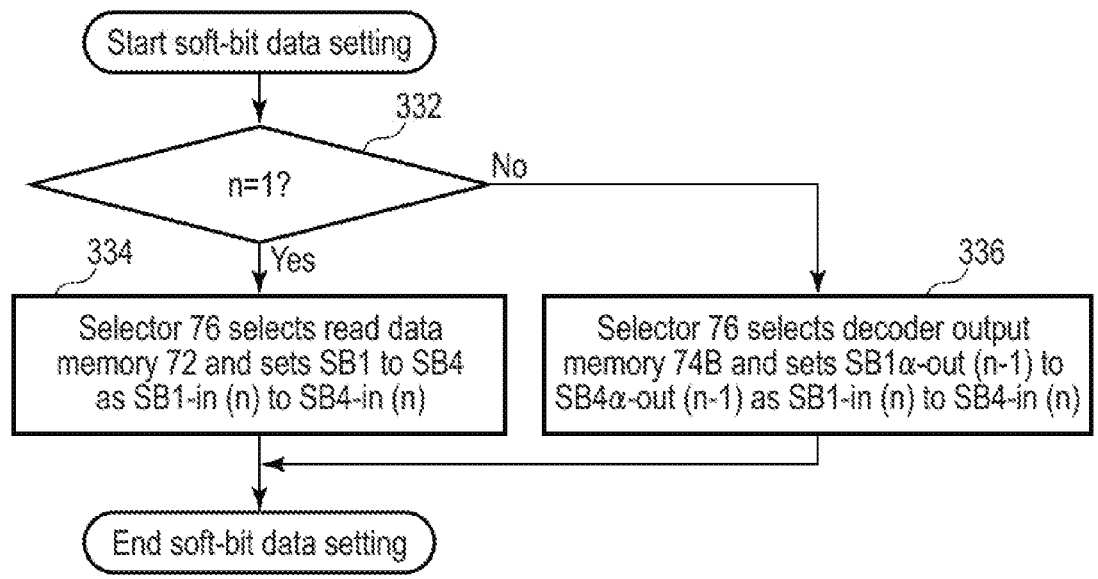
FIG. 29 is a flowchart showing an example of soft-bit data setting.

The third embodiment is different from the first embodiment in soft-bit data setting of step 228A. FIG. 29 is a flowchart showing an example of the soft-bit data setting of step 228A.

In step 332, the CPU 24 determines whether n=1 or not. If n=1 (the determination result of step 332 is YES), the CPU 24 causes the selector 76 to select the read data memory 72 in step 334. Accordingly, the outputs SB1 to SB4 of the read data memory 72 are set as inputs SB1-in in) to SB4-in (n) to the LLR conversion module 78. If n≠1 (n≥2) (the determination result of step 322 is NO), the CPU 24 controls the selector 76 to select the decoder output memory 74B in step 336. Accordingly, soft-bit data SB1α-out (n−1) to SB4α-out (n−1) stored in the decoder output memory 74B are set as inputs SB1-in (n) to SB4-in (n) to the LLR conversion module 78.

The explanation returns to FIG. 28, and in step 244B with which step 244 of FIG. 11 is replaced, the CPU 24 writes HB-out (n) and SB1-out (n) to SB4-out (n) which are the decoding result of the decoder 80 into the decoder output memory 74B. In following step 322, the CPU 24 stores the outputs SB1α-out (n), SB2α-out (n), SB3α-out (n), and SB4α-out (n) of the SB changing module 12 to the decoder output memory 74B.

Fourth Embodiment

In the first to third embodiments, the error correction performance is improved by using the previous decoding result as HB or SB to be decoded. On the other hand, in the fourth embodiment, the error correction performance is improved by changing the LLR table. In the fourth embodiment, if a bit has an absolute value of an LLR of greater than or equal to a certain value and has a value inverted by error correction, the absolute value of the LLR of the bit is changed to 1 or a value close to 1. The absolute value of the LLR being small means that the bit is likely to be inverted (that is, to be subjected to error correction). Accordingly, the error correction performance can be improved. An example of the LLR table change is a method using an LUT.

Figure 30:
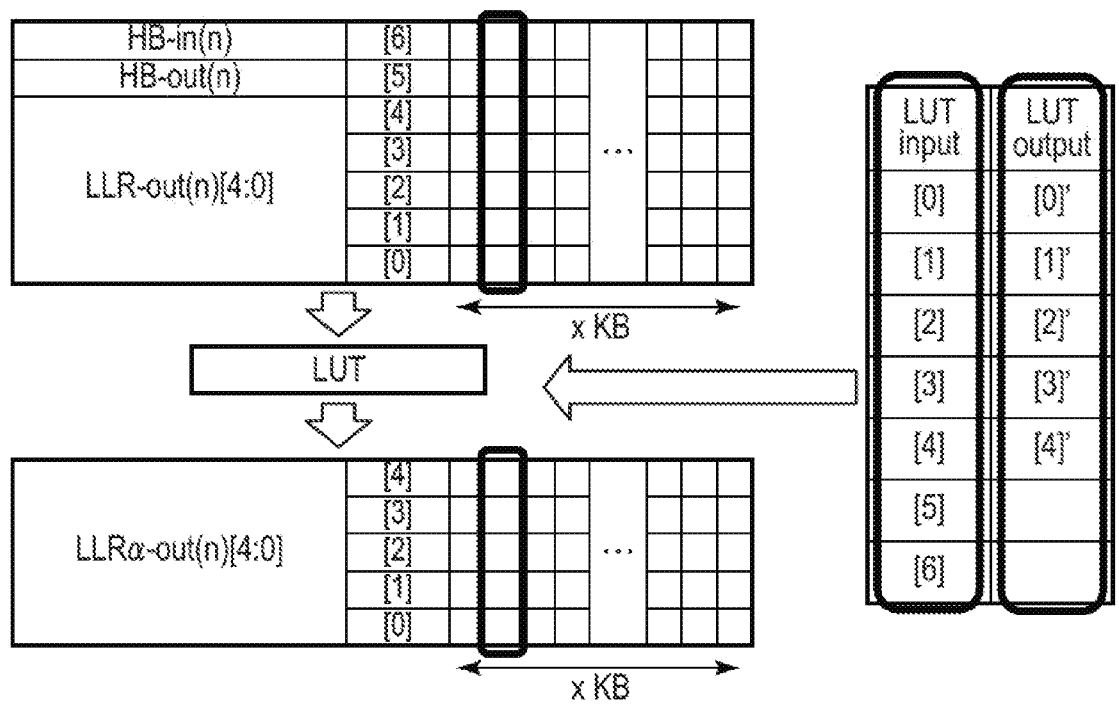
FIG. 30 is an illustration showing an example of LLR table change according to the fourth embodiment.

FIG. 30 shows the concept of rewriting an LLR table by using an LUT. The rewriting is executed for all bits of an x-KB frame.

The input of the LUT is seven-bit data, and the output of the LUT is five-bit data. The input bit [6] of the LUT is HB-in (n), the input, bit [5] of the LUT is HB-out (n), and the input bits [4:0] of the LUT are LLR-out (n) [4:0], The output bits [4:0] of the LUT are LLRα-out (n) [4:0]. The input bits [6:5] of the LUT detect whether a bit is inverted or not.

FIG. 31 shows a mapping table of LLR values. When an LLR value (decimal number) takes values from −15 to +15, the absolute value being greater than or equal to a certain value (for example, 8) means that the bits [4:3] of the LLR value (binary number) are "11" or "01".

FIG. 32 shows an example of the relationship between the input of the LUT and the output of the LUT. The input bits [6:5] of the LLR being "10" or "01" indicates that a bit corresponding to this LLR is inverted. Therefore, if the input bits [6:5] are "10" or "01" and the input bits [4:3] are "11", the output bits are "10001", and if the input bits [6:5] are "10" or "01" and the input bits [4:3] are "01", the output bits are "00001". That is, the absolute value of the output is 1.

A modification of the fourth embodiment will be explained. In the modification, when the LLR value is changed, as the number of decoding processes increases, the absolute value of the LLR value is increased. As the absolute value of the LLR value increases, the bit is less likely to be inverted. In the modification, as the number of decoding processes increases, the possibility of the decoding result being close to the correct answer increases, and therefore the bit is made less likely to be inverted. FIG. 33 shows the overview of the modification.

After the first decoding, LLR-out (1) is created by DLE2. The LLR value of data in an area A which is written as "1" and is read as "0" is changed to +1, and the LLR value of data in an area B which is written as "0" and is read as "1" is changed by −1. As the LLR value is changed as described above, an LLR table LLRα-out (1) is created. LLRα-out (1) is set as LLR table LLR-in (2) of the second decoding.

After the second decoding, LLR-out (2) is created by DLE2. The LLR value of data in the area A which is written as "1" and is read as "0" is changed to +2, and the LLR value of data in the area B which is written as "0" and is read as "1" is changed by −2. As the LLR value is changed as described above, an LLR table LLRα-out (2) is created. The LLRα-out (2) is set as LLR table LLR-in (3) of the third decoding.

After the third decoding, LLR-out (3) is created by DLE2. The LLR value of data in the area A which is written as "1" and is read as "0" is changed by +3, and the LLR value of data in the area B which is written as "0" and is read as "1" is changed by −3. As the LLR value is changed as described above, an LLR table LLRα-out (3) is created. The LLRα-out (3) is set as an LLR table LLR-in (4) of the fourth decoding. The data "1" is correct if it is read in an area where HB=1 but is incorrect if it is read in an area where HB=0. The modification aims to change the LLR value by ±n to make the data in the area A, which is most likely to be an incorrect answer, that is, least likely to be inverted because the absolute value of the LLR value is large, more likely to be inverted after the nth decoding.

FIGS. 34A and 34B show examples of an LUT for realizing the modification. After the first decoding, the LLR value is changed by using the LUT shown in FIG. 32, and after the second decoding, the LLR value is changed by using an LUT shown in FIG. 34A, and after the third decoding, the LLR value is changed by using an LUT shown in FIG. 34B. When the number of repetitions of decoding is n, the absolute value of the changed LLR value is changed by "1+(n−2)".

FIG. 35 is a block diagram showing an example of a soft-decision decoding module 40C according to the fourth embodiment. Many parts of the soft-decision decoding module 40C are the same as the configuration of the soft-decision decoding module 40A according to the second embodiment shown in FIG. 17. The soft-decision decoding module 40C is different from the soft-decision decoding module 40A in that an LLR changing module 124 is provided in place of the inverted bit detection module 104, the reliability determination module 106 and the bit inversion module 108, and the decoder output memory 74 (FIG. 9) is provided in place of the decoder output memory 74A.

The LLR changing module 124 includes an LUT such as that of FIG. 30 or FIG. 32, and inputs HB-in (n), HB-out (n) and LLR-out (n) and outputs LLRα-out (n). LLRα-out (n) is stored in a memory of the estimated LLR table creation module 88.

Figure 36:
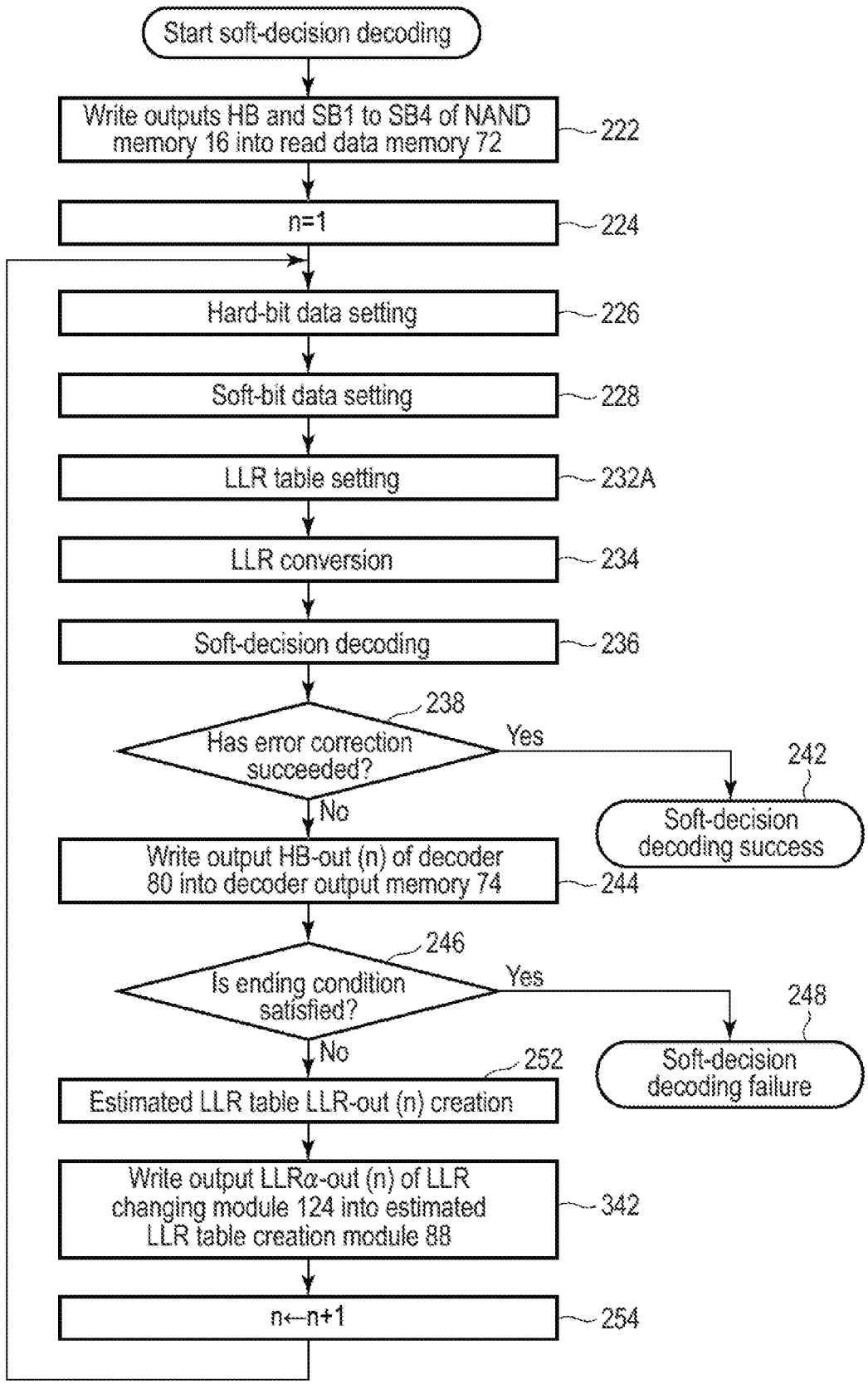
FIG. 36 is a flowchart showing an example of the operation of the soft-decision decoding module.

FIG. 36 is a flowchart showing an example of soft-decision decoding of the fourth embodiment. FIG. 36 is substantially the same but is different from the flowchart of the first embodiment shown in FIG. 11 in the following point.

The fourth embodiment is different from the first embodiment in LLR table setting of step 232A. FIG. 37 is a flowchart showing an example of the LLR table setting of step 232A.

In step 352, the CPU 24 determines whether n=1 or not. If n=1 (the determination result of step 352 is YES), the CPU 24 causes the selector 90 to select the predetermined LLR table memory 82 in step 354. Accordingly, a predetermined LLR table LLR0 is set as an input LLR-in (n) to the LLR conversion module 78. If n≠1 (n≥2) (the determination result of step 352 is NO), the CPU 24 causes the selector 90 to select the estimated LLR table creation module 88 in step 356. Accordingly, the LLR table LLRα-out (n−1) stored in the memory of the estimated LLR table creation module 88 is set as an input LLR-in (n) to the LLR conversion module 78.

In step 342 which is newly added between step 252 and step 254, the CPU 24 writes the output LLRα-out (n) of the LLR changing module 124 to the memory of the estimated LLR table creation module 88.

Fifth Embodiment

The above-described embodiments can be appropriately combined. For example, third embodiment and the first embodiment or the second embodiment may be combined. That is, hard-bit data of the previous decoding result may be used as hard-bit data to be decoded this time, and soft-bit data of the previous decoding result may be used as soft-bit data to be decoded this time. In addition, the fourth embodiment and the first embodiment or the second embodiment may be combined. That is, hard-bit data of the previous decoding result may be used as hard-bit data to be decoded this time, and the LLR value may be changed. Furthermore, the third embodiment and the fourth embodiment and the first embodiment or the second embodiment may be combined.

FIG. 38 shows a soft-decision decoding module 40D according to the combination of the second embodiment, the third embodiment, and the fourth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. For example, each function block may be realized as hardware or computer software or a combination of them. In addition, steps in each flowchart of each embodiment are not limited to an illustrated order, and may be executed in an order different from the illustrated order or may be executed in parallel.

What is claimed is:
1. A decoding device comprising:
a converter configured to convert first data read from a nonvolatile memory and second data read from the nonvolatile memory to first likelihood information by using a first conversion table;
a decoder configured to decode the first likelihood information and output first output data relating to the first data and second output data relating to the second data;
a memory;
a controller configured to store the second output data into the memory when the decoder fails in decoding the first likelihood information; and
a creator module configured to create a second conversion table based on the first output data and the second output data output from the decoder when the decoder fails in decoding the first likelihood information, wherein
when the creator module creates the second conversion table, the converter is configured to convert the first data read from the nonvolatile memory and the second output data stored in the output memory to second likelihood information by using the second conversion table, and the decoder is configured to decode the second likelihood information.

2. The decoding device of claim 1, further comprising a changing module configured to invert an inverted hit having low reliability in the second output data.

3. The decoding device of claim 2, wherein the inverted bit having low reliability is a bit in which error correction has failed.

4. The decoding device of claim 2, wherein the inverted bit having low reliability is a bit having a posterior value of the second likelihood information of less than or equal to a certain value.

5. The decoding device of claim 1, further comprising a changing module configured to invert an inverted bit located in a hard error area of the first output data, and wherein
when the creator module creates the second conversion table, the converter is configured to convert the first output data changed by the changing module and the second output data stored in the output memory to second likelihood information by using the second conversion table.

6. The decoding device of claim 1, further comprising a changing module configured to rewrite the second likelihood information of an inverted bit having an absolute value of the second likelihood information of greater than or equal to a certain value to second likelihood information having a vale of less than a certain value.

7. A decoding method comprising:
converting first data read from a nonvolatile memory and second data read from the nonvolatile memory to first likelihood information by using a first conversion table;
decoding the first likelihood information to output first output data relating to the first data and second output data relating to the second data;
storing the second output data into an output memory when the decoding of the first likelihood information fails; and
creating a second conversion table based on the first output data and the second output data when the decoding of the first likelihood information fails, wherein
when the second conversion table is created, the first data read from the nonvolatile memory and the second output data stored in the output memory are converted to second likelihood information by using the second conversion table.

8. The decoding method of claim 7, further comprising inverting an inverted bit having low reliability in the second output data.

9. The decoding method of claim 8, wherein the inverted bit having low reliability is a bit in which error correction has failed.

10. The decoding method of claim 8, wherein the inverted bit having low reliability is a bit having a posterior value of the second likelihood information of less than or equal to a certain value.

11. The decoding method of claim 7, further comprising inverting an inverted bit located in a hard error area of the first output data, and wherein
when the creating the second conversion table, the first output data and the second output data stored in the output memory are converted to second likelihood information by using the second conversion table.

12. The decoding method of claim 7, further comprising rewriting the second likelihood information of an inverted bit having an absolute value of the second likelihood information of greater than or equal to a certain value to second likelihood information having a value of less than a certain value.

* * * * *